US007288361B2

(12) United States Patent
Kakino et al.

(10) Patent No.: US 7,288,361 B2
(45) Date of Patent: Oct. 30, 2007

(54) LITHOGRAPHIC PRINTING PROCESS

(75) Inventors: Ryuki Kakino, Shizuoka (JP); Naonori Makino, Shizuoka (JP); Sumiaki Yamasaki, Shizuoka (JP); Yasuhito Oshima, Shizuoka (JP)

(73) Assignee: Fujifilm Corporation, Tokyo (JP)

( * ) Notice: Subject to any disclaimer, the term of this patent is extended or adjusted under 35 U.S.C. 154(b) by 0 days.

(21) Appl. No.: 10/921,837

(22) Filed: Aug. 20, 2004

(65) Prior Publication Data

US 2005/0039620 A1 Feb. 24, 2005

(30) Foreign Application Priority Data

Aug. 22, 2003 (JP) ............................ 2003-299268

(51) Int. Cl.
*G03F 7/00* (2006.01)
*G03F 7/004* (2006.01)
*B41M 5/00* (2006.01)

(52) U.S. Cl. ................... 430/270.1; 430/302; 430/309; 430/434; 430/494; 430/944; 430/945; 101/463.1; 101/465; 101/466; 101/467

(58) Field of Classification Search ............ 430/270.1, 430/302, 309, 434, 494, 944, 945; 101/463.1, 101/465, 466, 467; 433/213, 214, 29, 218, 433/215, 219, 26, 203.1, 223
See application file for complete search history.

(56) References Cited

U.S. PATENT DOCUMENTS

| | | | | |
|---|---|---|---|---|
| 3,445,935 | A | 5/1969 | Marshall | |
| 3,508,334 | A | 4/1970 | Weissman | |
| 3,838,517 | A | 10/1974 | Michnick | |
| 3,979,829 | A | 9/1976 | Lemos | |
| 4,144,645 | A | 3/1979 | Marshall | |
| 4,353,696 | A | 10/1982 | Bridges | |
| 4,473,354 | A | 9/1984 | Rigaud | |
| 4,526,542 | A | 7/1985 | Kochis | |
| 4,941,826 | A | 7/1990 | Loran et al. | |
| 5,545,039 | A | 8/1996 | Mushabac | |
| 5,575,656 | A | 11/1996 | Hajjar | |
| 5,941,706 | A | 8/1999 | Ura | |
| 6,511,323 | B1 | 1/2003 | Wilkinson | |
| 6,864,040 | B2 * | 3/2005 | Muller et al. | 430/287.1 |
| 6,925,205 | B2 * | 8/2005 | Leedham et al. | 382/167 |
| 6,964,567 | B2 * | 11/2005 | Kerschbaumer et al. | 433/26 |
| 2003/0068575 | A1 * | 4/2003 | Yanaka | 430/270.1 |
| 2003/0207235 | A1 * | 11/2003 | der Zel | 433/223 |
| 2005/0028697 | A1 * | 2/2005 | Makino et al. | 101/450.1 |

FOREIGN PATENT DOCUMENTS

| | | | |
|---|---|---|---|
| EP | 0 720 057 | A1 | 3/1996 |
| EP | 0 911 153 | A1 | 4/1999 |
| EP | 2000-122272 | | 4/2000 |
| EP | 1 072 402 | A2 | 1/2001 |
| EP | 1 226 936 | A2 | 7/2002 |
| EP | 1 235 105 | A2 | 8/2002 |
| EP | 1 393 899 | A2 | 3/2004 |
| EP | 1 502 736 | A2 | 2/2005 |
| JP | 07-285275 | | 10/1995 |
| JP | 10-282672 | | 10/1998 |
| WO | WO 02/00442 | A1 | 1/2002 |
| WO | WO 02/21215 | A1 | 3/2002 |

* cited by examiner

*Primary Examiner*—Amanda Walke
(74) *Attorney, Agent, or Firm*—Sughrue Mion, PLLC

(57) ABSTRACT

A lithographic printing process which comprises the steps of: imagewise exposing to infrared light a presensitized lithographic plate which comprises a hydrophilic support and a removable image-forming layer containing an infrared absorbing agent having the absorption maximum within an infrared region and a dye precursor having substantially no absorption within a visible region to change the dye precursor to a visible dye having an absorption within a visible region within the exposed area, and to make the image-forming layer irremovable within the exposed area; removing the image-forming layer within the unexposed area of the lithographic plate mounted on a cylinder of a printing press; and then printing an image with the lithographic plate mounted on the cylinder of the printing press. The other processes are also disclosed.

5 Claims, No Drawings

LITHOGRAPHIC PRINTING PROCESS

FIELD OF THE INVENTION

The present invention relates to a lithographic printing process involving on press development. The invention also relates to a lithographic printing process without conducting development.

BACKGROUND OF THE INVENTION

A lithographic printing plate generally comprises a hydrophobic imaging area, which receives oily ink in a printing process, and a hydrophilic non-imaging area, which receives dampening water. A conventional lithographic process usually comprises steps of masking a presensitized (PS) plate, which comprises a hydrophilic support and a hydrophobic photosensitive resin layer, with a lith film, exposing the plate to light through the lith film, and then developing the plate to remove a non-imaging area with a developing solution.

Nowadays a computer electronically processes stores and outputs image information as digital data. A presensitized lithographic plate is preferably scanned directly with a highly directive active radiation such as a laser beam without use of a lith film to form an image according to a digital data. The term of Computer to Plate (CTP) means the lithographic process of forming a printing plate according to digital image data without use of a lith film.

The conventional lithographic process of forming a printing plate has a problem about CTP that a wavelength region of a laser beam does not match a spectral sensitivity of a photosensitive resin.

The conventional PS plate requires a step of dissolving and removing a non-imaging area (namely, developing step). The developed printing plate should be further subjected to post-treatments such as a washing treatment using water, a rinsing treatment using a solution of a surface-active agent, and a desensitizing treatment using a solution of gum arabic or a starch derivative. The additional wet treatments are disadvantageous to the conventional PS plate. Even if an early step (image-forming step) in a lithographic process is simplified according to a digital treatment, the late step (developing step) comprises such troublesome wet treatments that the process as a whole cannot be sufficiently simplified.

The printing industry as well as other industries is interested in protection of global environment. Wet treatments inevitably influence global environment. The wet treatments are preferably simplified, changed into dry treatments or omitted from a lithographic process to protect global environment.

For example, a presensitized lithographic printing plate comprises a hydrophilic layer comprising colloid such as silica provided on a lipophilic layer (described in International Patent Application Nos. 94/18005, 98/40212 and 99/19143). The plate was imagewise exposed to light to abrade the hydrophilic layer within the exposed area. A heat-sensitive presensitized lithographic plate comprises a water-soluble or hydrophilic overcoating layer provided on the hydrophilic layer to prevent abrasion dust from scattering (described in Japanese Patent Provisional Publication Nos. 2001-096936 and 2002-086946).

Further, a press development method comprises the steps of attaching an exposed presensitized printing plate to a cylinder of a printer, and rotating the cylinder while supplying dampening water and ink to the plate to remove a non-imaging area from the plate. Immediately after exposing the presensitized plate to light, the plate can be installed in a printer. A lithographic process can be completed while conducting a usual printing treatment.

A presensitized lithographic printing plate suitable for the press development method must have a photosensitive layer soluble in dampening water or a solvent of ink. The presensitized plate should easily be treated under room light to be subjected to a press development in a printer placed under room light.

A conventional PS plate cannot satisfy the above-described requirements.

Japanese Patent No. 2,938,397 (corresponding to European Patent No. 0770494, and U.S. Pat. Nos. 6,030,750 and 6,096,481) discloses a method for making a lithographic printing plate. The method uses an imaging element (presensitized plate) comprising on a hydrophilic surface of a lithographic based an image forming layer comprising hydrophobic thermoplastic polymer particles capable of coalescing under the influence of heat and dispersed in a hydrophilic binder and a compound capable of converting light to heat. The method comprising the steps of imagewise exposing to light the imaging element; and developing a thus obtained imagewise exposed imaging element by mounting it on a print cylinder of a printing press and supplying an aqueous dampening liquid or ink to the image forming layer while rotating the printer cylinder.

The imaging element can be treated under room light because the element has sensitivity within an infrared region.

Japanese Patent Publication Nos. 2001-277740, 2002-029162, 2002-046361 and 2002-137562 disclose presensitized lithographic printing plate in which microcapsules containing a polymerizable compound are dispersed in place of the thermoplastic polymer particles.

A Computer to Cylinder (CTC) method has been proposed to advance digitalization from the stage of the CTP method. The CTC method can prepare a lithographic plate on a cylinder of a press machine by merely exposing the plate to light corresponding to digital image data without conducting development or other processes after the exposing step. The printing can be conducted immediately after preparing the lithographic plate.

A presensitized lithographic plate for the CTC method preferably has a hydrophilic image-forming layer that can be changed hydrophobic within a heated area, or have a hydrophobic image-forming layer that can be changed hydrophilic within a heated area.

When heating a hydrophilic polymer having a carboxyl group that can be decarboxylated (e.g., a group corresponding to sulfonylacetic acid), the polymer is changed to hydrophobic by a decarboxylation reaction. A presensitized lithographic plate having a hydrophilic image-forming layer that can be changed to hydrophobic within a heated area can be formed by using the above-mentioned hydrophilic polymer (described in Japanese Patent Provisional Publication Nos. 2000-122272 and 2001-33949). The hydrophilic polymer is preferably cross-linked or used in combination with a cross-linked polymer to prepare a lithographic plate without development.

A presensitized lithographic plate comprises an image-forming layer containing thermally fusible polymer particles and a hydrophilic polymer (described in Japanese Patent Provisional Publication No. 2002-226597). The plate is imagewise heated to fuse the particles to form a hydrophobic area as well as a not heated hydrophilic area in the image-forming layer.

When heating a hydrophobic polymer having a sulfonimido, disulfone or a sulfonate ester group, the polymer is changed to a hydrophilic polymer having a sulfo group. A presensitized lithographic plate having a hydrophobic image-forming layer that can be changed to hydrophilic within a heated area can be formed by using the above-mentioned hydrophobic polymer (described in Japanese Patent Provisional Publication Nos. 10(1998)-282642, 10(1998)-282644, 10(1998)-282646, 10(1998)-282672 and 11(1999)-309953). The hydrophobic polymer is preferably cross-linked or used in combination with a cross-linked polymer to prepare a lithographic plate without development.

A conventional presensitized lithographic plate has a colored image-forming layer to confirm an image after processing the plate (after development) and before printing (mounting the plate on a press machine).

According to a CTP or CTC method, an image cannot be confirmed before printing (at the stage of imagewise exposure or heating), even if the image-forming layer is colored. In the CTP or CTC method, the entire image-forming layer is still colored before mounting the plate on a press machine, since the lithographic printing is developed on a press machine or processed without development. Therefore, a printing-out agent is usually added to a presensitized lithographic plate for the CTP or CTC method. The printing-out agent has a function of forming a visible image at the imagewise exposing or heating stage to confirm the formed image.

An example of the printing-out agent is a combination of a compound forming an acid, a base or a radical when the compound is heated with another compound having a color that can be changed when the compound is reacted with the acid, the base or the radical (described in Japanese Patent Provisional Publication No. 11(1999)-277927). Another example of the printing-out agent is a thermally decomposable dye that is decomposed at a temperature of not higher than 250° C. (described in European Patent Application No. 1300241).

SUMMARY OF THE INVENTION

An object of the present invention is to confirm an image after imagewise exposing a presensitized lithographic plate to light and before printing an image with the plate mounted on a press machine.

The present invention provides a lithographic printing process which comprises the steps of:

imagewise exposing to infrared light a presensitized lithographic plate which comprises a hydrophilic support and a removable image-forming layer containing an infrared absorbing agent having the absorption maximum within an infrared region and a dye precursor having substantially no absorption within a visible region to change the dye precursor to a visible dye having an absorption within a visible region within the exposed area, and to make the image-forming layer irremovable within the exposed area;

removing the image-forming layer within the unexposed area of the lithographic plate mounted on a cylinder of a printing press; and then printing an image with the lithographic plate mounted on the cylinder of the printing press.

The invention also provides a lithographic printing process which comprises the steps of:

imagewise exposing to infrared light a presensitized lithographic plate which comprises a hydrophilic support and an irremovable image-forming layer containing an infrared absorbing agent having the absorption maximum within an infrared region and a dye precursor having substantially no absorption within a visible region to change the dye precursor to a visible dye having an absorption within a visible region within the exposed area, and to make the image-forming layer removable within the exposed area;

removing the image-forming layer within the exposed area of the lithographic plate mounted on a cylinder of a printing press; and then printing an image with the lithographic plate mounted on the cylinder of the printing press.

The invention further provides a lithographic printing process which comprises the steps of:

imagewise exposing to infrared light a presensitized lithographic plate which comprises a support and a hydrophilic image-forming layer containing an infrared absorbing agent having the absorption maximum within an infrared region and a dye precursor having substantially no absorption within a visible region to change the dye precursor to a visible dye having an absorption within a visible region within the exposed area, and to make the image-forming layer hydrophobic within the exposed area; and then printing an image with the lithographic plate mounted on a cylinder of a printing press.

The invention furthermore provides a lithographic printing process which comprises the steps of:

imagewise exposing to infrared light a presensitized lithographic plate which comprises a support and a hydrophobic image-forming layer containing an infrared absorbing agent having the absorption maximum within an infrared region and a dye precursor having substantially no absorption within a visible region to change the dye precursor to a visible dye having an absorption within a visible region within the exposed area, and to make the image-forming layer hydrophilic within the exposed area; and then printing an image with the lithographic plate mounted on a cylinder of a printing press.

The invention still furthermore provides a lithographic printing process which comprises the steps of:

imagewise exposing to infrared light a presensitized lithographic plate which comprises a support, an ink-receiving layer and a hydrophilic layer in order, said ink-receiving layer containing a dye precursor having substantially no absorption within a visible region, and said ink-receiving layer or said hydrophilic layer containing an infrared absorbing agent having the absorption maximum within an infrared region to change the dye precursor to a visible dye having an absorption within a visible region within the exposed area, and to abrade the hydrophilic layer within the exposed area; and then printing an image with the lithographic plate mounted on a cylinder of a printing press.

The dye precursor preferably decomposes on heating or light exposure to form the visible dye by releasing a partial chemical structure from the dye precursor.

The dye precursor preferably has a chemical structure in which a releasable group is attached to nitrogen atom. The nitrogen atom to which the releasable group is attached is preferably combined to a benzene ring contained in the dye precursor.

The dye precursor has an effect that the sensitivity of the presensitized lithographic plate is not degraded compared with other colored printing out agents.

DETAILED DESCRIPTION OF THE INVENTION

[Dye Precursor Contained in Plate]

In the present invention, at least one layer (preferably image-forming layer) of a presensitized lithographic plate contains a dye precursor having substantially no absorption within a visible region. The visible region means a wavelength range between 400 to 760 nm. The dye precursor having substantially no absorption within a visible region means that the molar extinction coefficient (ε) is not higher than 5,000 within the wavelength range between 400 to 760 nm. The molar extinction coefficient (ε) is preferably not higher than 4,000, and more preferably not higher than 3,000.

The dye precursor can be changed to a visible dye having absorption within a visible region when the dye precursor is heated or irradiated with light. The visible dye having absorption within a visible region means that the molar extinction coefficient (ε) is not lower than 10,000 within the wavelength range between 400 to 760 nm. The molar extinction coefficient (ε) is preferably not lower than 15,000, more preferably not lower than 20,000, and most preferably not lower than 30,000.

The above-mentioned visible region is preferably in the wavelength range of 440 to 740 nm, more preferably in the range of 460 to 720 nm, and most preferably in the range of 500 to 700 nm.

An image formed on a printing plate can be confirmed by the color formed from the dye precursor. ΔOD at the λmax wavelength of the formed color is preferably not smaller than 0.05, more preferably not smaller than 0.10, further preferably not smaller than 0.15, and most preferably not smaller than 0.20 to confirm the formed image. ΔOD at the λmax wavelength of the formed color is usually not larger than 3.

The dye precursor preferably decomposes on heating or light exposure to form the visible dye by releasing a partial chemical structure from the dye precursor. The dye precursor preferably has a chemical structure in which a releasable group is attached to nitrogen atom. The nitrogen atom to which the releasable group is attached is preferably combined to a benzene ring contained in the dye precursor.

A presensitized lithographic plate is imagewise exposed to infrared light. Consequently, the dye precursor is exposed to infrared light without conducting any additional process. The infrared light can be converted into heat by a function of an infrared absorbing agent contained in the presensitized lithographic plate. Consequently, the dye precursor is heated without conducting any additional process.

The dye precursor more preferably has a p-phenylenediamine structure. The releasable group is preferably attached to one of the two nitrogen atom of the p-phenylenediamine structure. A linking group can intervene between the releasable group and the nitrogen atom.

The benzene ring of the p-phenylenediamine structure can have a substituent group other than the two amino groups. The substituent group preferably is an alkyl group, a substituted alkyl group, an aryl group, an aromatic heterocyclic group or an acyl group, more preferably is an alkyl group or a substituted alkyl group, and most preferably is an alkyl group. The alkyl group or the alkyl moiety of the substituted alkyl group can have a cyclic or branched structure. The alkyl group or the alkyl moiety of the substituted alkyl group preferably has 1 to 20 carbon atoms, and more preferably has 1 to 14 carbon atoms.

The other nitrogen atom (to which the releasable group is not attached) of the p-phenylenediamine structure is preferably contained in (not substituted) amino or an alkyl amino group. The alkyl moiety of the alkyl amino group preferably has a chain structure rather than a cyclic structure. The alkyl moiety of the alkyl amino group preferably has 1 to 20 carbon atoms, and more preferably has 1 to 14 carbon atoms.

Two releasable groups are preferably attached to one nitrogen atom directly or by a linking group. One of the two releasable group more preferably is directly attached to nitrogen atom, and the other can be attached to the nitrogen atom directly or by a linking group.

A preferred dye precursor is represented by the formula (I).

$$R_2N—(p\text{-}Ph)—N(—Y)\text{-}L\text{-}Z \quad (I)$$

In the formula (I), each of the two groups represented by R independently is hydrogen or an alkyl group having 1 to 20 carbon atoms.

In the formula (I), p-Ph is p-phenylene, which can be substituted with an alkyl group having 1 to 20 carbon atoms.

In the formula (I), L is a divalent linking group.

In the formula (I), each of Y and Z independently is a releasable group.

The dye precursor represented by the formula (I) can be changed to a visible dye represented by the formula (II) when the dye precursor is heated.

$$R_2N—(p\text{-}Ph)—N{=}L{+}Y\text{-}Z \quad (II)$$

In the formula (II), R, p-Ph, L, Y and Z have the same meanings defined in the formula (I), except that the structure and the chemical bond of L is changed from the formula (I).

Examples of the linking groups include an alkylene group, an alkenylene group, an arylene group, a divalent heterocyclic group, —O—, —S—, —CO—, —NH—, —NR— (R is an aliphatic group, an aromatic group or a heterocyclic group), —SO—, $—SO_2—$ or a combination thereof.

Examples of the releasable groups include a halogen atom, hydroxyl, an aliphatic group, a heterocyclic group, —O—R, —S—R, —SO—R, $—SO_2—R$, —Se—R, $—N(—R)_2$, —CO—O—R, —CO—NH—R, $—P(=O)(—O—R)_2$ and —N(—R)—CO—O—R. R is an aliphatic group, an aromatic group or a heterocyclic group.

In the present specification, the aliphatic group means an alkyl group, a substituted alkyl group, an alkenyl group, a substituted alkenyl group, an alkynyl group or a substituted alkynyl group. The alkyl group, the substituted alkyl group, the alkenyl group and the substituted alkenyl group are preferred. The alkyl group and the substituted alkyl group are more preferred.

The aliphatic group can have a cyclic or branched structure. The aliphatic group preferably has 1 to 30 carbon atoms, more preferably has 1 to 20 carbon atoms, further preferably has 1 to 15 carbon atoms, furthermore preferably has 1 to 10 carbon atoms, and most preferably has 1 to 6 carbon atoms.

Examples of the substituent groups of the aliphatic group (the substituted alkyl group, the substituted alkenyl group or the substituted alkynyl group) include a halogen atom, cyano, thiocyano, nitro, hydroxyl, mercapto, formyl, carboxyl, amino, carbamoyl, sulfo, sulfamoyl, an aromatic group, a heterocyclic group, —O—R, —S—R, —SO—R, —CO—R, $—SO_2—R$, —O—CO—R, —CO—O—R, —O—CO—O—R, —NH—R, $—N(—R)_2$, —NH—CO—R, —CO—NH—R, $—CO—N(—R)_2$, $—O—SO_2—R$, $—SO_2—O—R$, $—NH—SO_2—R$, $—SO_2—NH—R$ and $-SO_2-N(-R)_2$. R is an aliphatic group, an aromatic group or a heterocyclic group.

In the present specification, the aromatic group means an aryl group or a substituted aryl group. The aryl group and the aryl moiety of the substituted aryl group preferably is phenyl or naphthyl, and more preferably is phenyl.

Examples of the substituent groups of the aromatic group (the substituted aryl group) include an aliphatic group in addition to the examples of the substituent groups of the aliphatic group.

In the present specification, the heterocyclic group means a not substituted heterocyclic group and a substituted heterocyclic group. The heterocyclic ring of the heterocyclic group preferably is a four-membered to seven-membered ring, and more preferably is a five-membered or six-membered ring. The hetero atom of the heterocyclic ring preferably is nitrogen, oxygen or sulfur. The heterocyclic ring can be condensed with another heterocyclic ring, an aliphatic ring or an aromatic ring.

Examples of the substituent groups of the heterocyclic group include oxo (=O), thio (=S) and imino (=NH or =N—R, wherein R is an aliphatic group, an aromatic group or a heterocyclic group) in addition to the examples of the substituent groups of the aromatic group.

Japanese Patent No. 2,744,101 discloses a dye precursor that causes a decomposition reaction or an intramolecular reaction on heating or light exposure to form a visible dye having absorption within a visible region.

The image-forming layer contains the dye precursor preferably in an amount of 1 to 30 wt. %, more preferably in an amount of 1 to 20 wt. %, and most preferably in an amount of 1 to 15 wt. %.

[Lithographic Process and Image Forming Layer]

The lithographic printing process can be classified into five embodiments.

The first embodiment comprises the steps of:

imagewise exposing to infrared light a presensitized lithographic plate which comprises a hydrophilic support and a removable image-forming layer containing an infrared absorbing agent having the absorption maximum within an infrared region to make the image-forming layer irremovable within the exposed area;

removing the image-forming layer within the unexposed area of the lithographic plate mounted on a cylinder of a printing press; and then printing an image with the lithographic plate mounted on the cylinder of the printing press.

The image-forming layer of the first embodiment can be formed by using a hydrophilic polymer having a carboxyl group that can be decarboxylated (e.g., a group corresponding to a-sulfonylacetic acid) described in Japanese Patent Provisional Publication No. 2000-122272.

The image-forming layer of the first embodiment can be a thermally cross-linkable layer comprising an acid precursor (such as a potential Brønsted acid or s-triazine compound), a cross-linking agent (rezol resin) and a binder (not cross-linked polymer) in addition to the infrared absorbing agent (as is described in Japanese Patent Provisional Publication Nos. 7(1995)-20629, 7(1995)-271029).

The image-forming layer of the first embodiment can also be a light-sensitive layer comprising a hydrophilic resin in which thermally plastic hydrophobic polymer fine particles are dispersed. The layer is scanned with an infrared laser beam to fuse the thermally plastic hydrophobic polymer fine particles to form an image. The non image area can be removed on a press machine by supplying dampening water or an ink while mounting the plate on the press machine (describe in Japanese Patent No. 2938397).

The second embodiment comprises the steps of:

imagewise exposing to infrared light a presensitized lithographic plate which comprises a hydrophilic support and an irremovable image-forming layer containing an infrared absorbing agent having the absorption maximum within an infrared region to make the image-forming layer removable within the exposed area;

removing the image-forming layer within the exposed area of the lithographic plate mounted on a cylinder of a printing press; and then printing an image with the lithographic plate mounted on the cylinder of the printing press.

The image-forming layer of the second embodiment can be formed by using a polymer that can be aggregated (such as novolak resin). After heating the polymer, the solubility of the polymer increased. A positive image can be formed by the formed difference in solubility (described in Japanese Patent Publication No. 46(1971)-27919 and Japanese Patent Provisional Publication No. 7(1995)-285275).

The third embodiment comprises the steps of:

imagewise exposing to infrared light a presensitized lithographic plate which comprises a support and a hydrophilic image-forming layer containing an infrared absorbing agent having the absorption maximum within an infrared region to make the image-forming layer hydrophobic within the exposed area; and then printing an image with the lithographic plate mounted on a cylinder of a printing press.

The image forming layer of the third embodiment can be formed by using a hydrophilic polymer having a carboxyl group that can be decarboxylated (e.g., a group corresponding to α-sulfonylacetic acid) described in Japanese Patent Provisional Publication No. 2000-122272. The hydrophilic polymer is preferably cross-linked or used in combination with a cross-linked polymer.

The fourth embodiment comprises the steps of:

imagewise exposing to infrared light a presensitized lithographic plate which comprises a support and a hydrophobic image-forming layer containing an infrared absorbing agent having the absorption maximum within an infrared region to make the image-forming layer hydrophilic within the exposed area; and then printing an image with the lithographic plate mounted on a cylinder of a printing press.

The image forming layer of the third embodiment can be formed by using a hydrophobic polymer having a sulfonimido, disulfone or a sulfonate ester group (described in Japanese Patent Provisional Publication Nos. 10(1998)-282642, 10(1998)-282644, 10(1998)-282646 and 10(1998)-282672). The polymer is changed to a hydrophilic polymer having a sulfo group by heating the polymer. The hydrophobic polymer is preferably cross-linked or used in combination with a cross-linked polymer.

The fifth embodiment comprises the steps of:

imagewise exposing to infrared light a presensitized lithographic plate which comprises a support, an ink-receiving layer and a hydrophilic layer in order, said ink-receiving layer or said hydrophilic layer containing an infrared absorbing agent having the absorption maximum within an infrared region to abrade the hydrophilic layer within the exposed area; and then printing an image with the lithographic plate mounted on a cylinder of a printing press.

The ink-receiving layer and the hydrophilic layer of the fifth embodiment is described in International Patent Application Nos. 94/18005, 98/40212 and 99/19143). A water-soluble or hydrophilic overcoating layer can be provided on the hydrophilic layer to prevent abrasion dust from scattering (as is described in Japanese Patent Provisional Publication Nos. 2001-096936 and 2002-086946).

[Infrared Absorbing Agent]

A presensitized lithographic plate is preferably exposed to infrared light by scanning the plate with an infrared laser bean having a wavelength of 760 to 1,200 nm. Accordingly, an infrared absorbing agent preferably has a function of absorbing the infrared laser bean having a wavelength of 760 to 1,200 nm.

The infrared absorbing agent can further have a function of converting light to heat. The formed thermal energy can decompose a polymerization initiator (a radical precursor) to form a radical, which further causes a polymerization reaction.

The infrared absorbing agent can further have another function as an infrared sensitizer, which can convert light to a chemical energy, which excites a polymerization initiator to cause a polymerization reaction.

The infrared absorbing agent can have two or more above-mentioned functions.

The infrared absorbing agent preferably is an infrared absorbing dye. The infrared absorbing agent is commercially available. The infrared absorbing dyes are described in "Handbook of Dyes (written in Japanese)", 1970, edited by Association of Organic Synthetic Chemistry.

Examples of the infrared absorbing dyes include azo dyes, metal complex salt azo dyes, pyrazolone azo dyes, naphthoquinone dyes (described in Japanese Patent Provisional Publication Nos. 58(1983)-112793, 58(1983)-224793, 59(1984)-48187, 59(1984)-73996, 60(1985)-52940 and 60(1985)-63744), anthraquinone dyes, phthalocyanine dyes (described in Japanese Patent Provisional Publication No. 11(1999)-235883), squarilium dyes (described in Japanese Patent Provisional Publication No. 58(1983)-112792), pyrylium dyes (U.S. Pat. Nos. 3,881,924, 4,283,475, Japanese Patent Provisional Publication Nos. 57(1982)-142645, 58(1983)-181051, 58(1983)-220143, 59(1984)-41363, 59(1984)-84248, 59(1984)-84249, 59(1984)-146063, 59(1984)-146061, Japanese Patent Publication Nos. 5(1993)-13514 and 5(1993)-19702), carbonium dyes, quinoneimine dyes and methine dyes (described in Japanese Patent Provisional Publication Nos. 58(1983)-173696, 58(1983)-181690 and 58(1983)-194595).

Methine dyes are preferred. Cyanine dyes (described in British Patent No. 434,875, U.S. Pat. No. 4,973,572, Japanese Patent Provisional Publication Nos. 58(1983)-125246, 59(1984)-84356, 59(1984)-216146 and 60(1985)-78787) are more preferred.

The cyanine dye is defined by the following formula.

(Cyanine dye) Bo-Lo=Bs

In the formula, Bs is a basic nucleus, Bo is an onium form of a basic nucleus, and Lo is a methine chain consisting of an odd number of methines.

In the infrared absorbing methine dye, Lo preferably is a methine chain consisting of seven methines.

The centered methine (at the meso-position) can have a substituent group. Examples of the substituent groups include a halogen atom, diphenylamino, —O—R, —S—R, —NH—R and 1-pyridinio.

R is an aliphatic group (preferably has 1 to 12 carbon atoms), an aromatic group (preferably has 6 to 12 carbon atoms) and a heterocyclic group (preferably has 1 to 12 carbon atoms).

The 1-pyridinio group can have a substituent group or a counter anion. Examples of the substituent groups include an alkyl group, an aryl group, amino, a substituted amino group and a halogen atom. Examples of the counter anions include a halide ion, a perchlorate ion, tetrafluoroborate ion, hexafluorophosphate ion and an arylsulfonate ion, The two methins neighboring the centered methine (at the meso-position) can have a substituent group such as a hydrocarbon (aliphatic or aromatic) group having 1 to 12 carbon atoms. The two substituent group can be combined to form a five-membered or six-membered ring.

The other methines of the methine chain may have a substituent group, such as a hydrocarbon (aliphatic or aromatic) group having 1 to 12 carbon atoms. However, the other methines preferably have no substituent groups.

Each of the two basic nuclei preferably has a five-membered heterocyclic ring containing at least one nitrogen atom. A hydrocarbon (aliphatic or aromatic) group is preferably attached to the nitrogen atom. The hydrocarbon group can have a substituent group. Examples of the substituent groups include an alkoxy group having 1 to 12 carbon atoms, carboxyl and sulfo.

The five-membered heterocyclic ring having at least one nitrogen atom (in which the nitrogen atom is the 1-position) preferably attached to the methine chain at the 1-position of the heterocyclic ring. The five-membered heterocyclic ring having at least one nitrogen atom preferably has sulfur atom or carbon atom substituted with two alkyl groups having 1 to 12 carbon atoms (dimethylmethylene) at 3-position. The five-membered heterocyclic ring having at least one nitrogen atom is preferably condensed with an aromatic ring (e.g., benzene ring, naphthalene ring). The aromatic ring is preferably condensed between 4-position and 5-position of the five membered ring. The aromatic ring can have a substituent group. Examples of the substituent groups include a hydrocarbon (aliphatic or aromatic) group, a halogen atom, an alkoxy group having 1 to 12 carbon atoms, an acyl group and a halogenated alkyl group having 1 to 12 carbon atoms.

The cyanine dye can have a counter anion. The molecular structure of the cyanine dye can have an anionic group as a substituent group in place of the counter anion. Examples of the counter anions include a halide ion, perchlorate ion, tetrafluoroborate ion, hexafluorophosphate ion and a sulfonate ion. Perchlorate ion, hexafluorophosphate ion and an arylsulfonate ion are preferred.

An infrared absorbing pigment can be used as an infrared absorbing agent.

The pigments are described in "Handbook of Color Index (CI)", "Latest Handbook of pigments (written in Japanese)", 1977, edited by Japan Association of Pigment Technology, "Latest Application Technology of Pigment (written in Japanese)", 1986, published by CMC, and "Technology of Printing Ink (written in Japanese)", 1984, published by CMC.

Pigments include black pigments, yellow pigments, orange pigments, brown pigments, red pigments, purple pigments, blue pigments, green pigments, fluorescent pigments, metallic powder pigments, polymer combined pigments, azo lake pigments, condensed azo pigments, chelate azo pigment, phthalocyanine pigments, anthraquinone pigments, perylene pigments, perinone pigments, thioindigo pigments, quinacridone pigments, dioxazine pigments, isoindolinone pigments, quinophthalone pigments, dyed lake pigments, azine pigments, nitroso pigments, nitro pigments, natural pigments, inorganic pigments and carbon black. Carbon black is the most preferred infrared absorbing pigment.

The infrared absorbing pigment can be subjected to a surface treatment. Examples of the surface treatments include a process of coating the surface with a resin or a wax, a process of attaching a surface active agent to the surface, a process of combining the pigment surface with a reactive substance (e.g., silane coupling agent, an epoxy compound, a polyisocyanate). The surface treatment is described in "Characteristics and Applications of Metal Soap (written in Japanese)", edited by Saiwai-Shobo, "Technology of Printing Ink (written in Japanese)", 1984, published by CMC, and "Latest Application Technology of Pigment (written in Japanese)", 1986, published by CMC.

The pigment has an average particle size preferably in the range of 0.01 to 10 μm, more preferably in the range of 0.05 to 1 μm, and most preferably in the range of 0.1 to 1 μm. The average particle size is so adjusted to improve stability of the pigment particles in a coating solution or to form a uniform layer.

The pigments can be dispersed by a known dispersing method, which is usually used in preparation of ink or toner. The dispersing machines include an ultrasonic dispersing machine, a sand mill, an Attritor, a pearl mill, a super mill, a ball mill, an impeller, a disperser, a KD mill, a colloid mill, Dynatron, a three-rolls mill and a pressure needer. The dispersing method is described in "Latest Application Technology of Pigment (written in Japanese)", 1986, published by CMC.

The image-forming layer contains the infrared absorbing agent preferably in an amount of 0.1 to 20 wt. %, and more preferably in an amount of 1 to 10 wt. % based on the total amount of the image-forming layer.

The image-forming layer can comprises two or more layers, one of which can contain the infrared absorbing agent, and the other of which can contain the other components, such as a polymerization initiator, a polymerizable compound and a binder polymer.

The absorption at the maximum absorption wavelength (within the wavelength region of 760 to 1,200 nm) is preferably adjusted in the range of 0.3 to 1.2, and more preferably in the range of 0.4 to 1.1 measured according to a reflection method. The absorption is adjusted to conduct uniform polymerization reaction throughout the image-forming layer along the thickness direction, which improve membrane strength of the image area and adhesion between the support and the image area.

The absorption of the image-forming layer can be controlled by adjusting the amount of the infrared absorbing agent and the thickness of the image-forming layer. The absorption can be determined according to a conventional method. For example, the absorption can be determined by forming an image-forming layer (having a thickness adjusted to a dry thickness required in a lithographic plate) on a reflective support (such as an aluminum plate); and measuring the reflection density by a densitometer. The absorption can also be measured by a spectrophotometer according to a reflection method using an integrated sphere.

[Thermally Fusible Polymer Particles]

The image-forming layer of the first and third embodiments can contain thermally fusible polymer particles.

The thermally fusible polymer of the particles has a main chain such as a hydrocarbon (polyolefin), a polyester, polyamide, polyimide, polyurea, polyurethane, polyether or a combination thereof. The main chain preferably is the hydrocarbon or the polyurethane.

The main chain of the thermally fusible polymer can have a substituent group. Examples of the substituent groups include a halogen atom (F, Cl, Br, I), hydroxyl, mercapto, formyl, amino, carboxyl, carbamoyl, sulfo, sulfamoyl, phosphono, cyano, an aliphatic group, an aromatic group, a heterocyclic group, —O—R, —S—R, —CO—R, —NH—R, —N(—R)$_2$, —CO—O—R, —O—CO—R, —CO—NH—R, —NH—CO—R, —SO$_2$—R, —SO$_2$—O—R, —O—SO$_2$—R, —SO$_2$—NH—R, —NH—SO$_2$—R, —P(=O)(—O—R)$_2$. R is an aliphatic group, an aromatic group or a heterocyclic group. The acidic group or the basic group-can be dissociated or in the form of a salt with a counter ion.

Two or more substituent groups of the main chain can be combined to form an aliphatic ring or a heterocyclic ring. The formed ring can be combined to the main chain by a spiro bond. The formed ring can have a substituent group. Examples of the substituent groups include oxo and thio in addition to the substituent groups of the main chain.

The thermally fusible polymer has a weight average molecular weight preferably in the range of 500 to 1,000,000, more preferably in the range of 1,000 to 500,000, further preferably in the range of 2,000 to 200,000, and most preferably in the range of 5,000 to 100,000.

The thermally fusible polymer is contained in the image-forming layer preferably in an amount of 5 to 90 wt. %, and more preferably in an amount of 30 to 80 wt. %.

The thermally fusible polymer is preferably prepared according to an emulsion polymerization reaction to form particles of the thermally fusible polymer. In the emulsion polymerization reaction, the particles are formed simultaneously with synthesis of the polymer. Conditions for emulsion polymerization reaction are the same as the usual conditions for preparation of latex.

A surface active agent is preferably used in the emulsion polymerization reaction to form uniform particles. The surface active agents include a cationic surface active agent, an anionic surface active agent, a nonionic surface active agent and an amphoteric surface active agent. The amount of the surface active agent is preferably in the range of 0.01 to 10 wt. % based on the amount of the monomer.

The polymerization reaction is preferably conducted by using a polymerization initiator (a chain transfer agent). The amount of the polymerization initiator is preferably in the range of 0.05 to 10 wt. % based on the amount of the monomer.

The thermally fusible polymer particles can also be prepared by dissolving the thermally fusible polymer in an organic solvent (which preferably is not miscible with water), emulsifying the dispersion in an aqueous solution of a dispersing agent, and heating the emulsion to remove the solvent and to solidify the polymer as a particle.

The particles have a particle size preferably in the range of 5 to 500 nm, and more preferably in the range of 10 to 300 nm. The particle size distribution is preferably uniform.

Two or more fine particles can be used in combination.

[Hydrophilic Compound]

In the case that the image-forming layer contains particles or microcapsules, the image-forming layer preferably contains a hydrophilic compound as a binder of the particles or the microcapsules.

The hydrophilic compound preferably is a polymer. The hydrophilic polymer preferably has hydroxyl, carboxyl, sulfo, amino, or amido as a hydrophilic group. Carboxyl and sulfo can be in the form of salt.

Various natural, semi-synthetic or synthetic polymers can be used as the hydrophilic polymer.

Examples of the natural or semi-synthetic polymers include polysaccharides (e.g., gum arabic, starch derivatives, carboxymethyl cellulose, sodium salt thereof, cellulose acetate, sodium alginate) and proteins (e.g., casein, gelatin).

Examples of the synthetic polymers having hydroxyl as the hydrophilic group include polyhydroxyethyl methacrylate, polyhydroxyethyl acrylate, polyhydroxypropyl methacrylate, polyhydroxypropyl acrylate, polyhydroxybutyl methacrylate, polyhydroxybutyl acrylate, polyallylalcohol, polyvinylalcohol and poly-N-methylolacrylamide.

Examples of the synthetic polymers having carboxyl as the hydrophilic group include polymaleic acid, polyacrylic acid, polymethacrylic acid and salts thereof.

Examples of the synthetic polymers having other hydrophilic groups (e.g., amino, many ether bonds, hydrophilic heterocyclic groups, amido, sulfo) include polyethylene glycol, polyvinyl formal, polyvinyl butyral, polyvinylpyrrolidone, polyacrylamide, polymethacrylamide, poly(2-acrylamido-2-methylpropanesuldonic acid) and a salt thereof.

The hydrophilic polymer can be a copolymer comprising two or more hydrophilic repeating units of the above-mentioned hydrophilic synthetic polymers. The hydrophilic polymer can also be a copolymer comprising the hydrophilic repeating unit and a hydrophobic repeating unit (for example, repeating units of polyvinyl acetate or polystyrene). Examples of the copolymers include vinyl acetate-maleic acid copolymer, styrene-maleic acid copolymer and vinyl alcohol-vinyl acetate copolymer (partially saponified polyvinyl acetate). In the case where polyvinyl acetate is partially saponified into the vinyl alcohol-vinyl acetate copolymer, the saponification degree preferably is not less than 60%, and more preferably is not less than 80%.

Two or more hydrophilic polymers can be used in combination.

The image-forming layer contains the hydrophilic polymer preferably in an amount of 2 to 40 wt. %, and more preferably in an amount of 3 to 30 wt. %.

A hydrophilic compound of a low molecular weight (not polymer) can be used in place of or in addition to the hydrophilic polymer.

The hydrophilic compound of a low molecular weight preferably is a surface active agent. The surface active agents include a nonionic surface active agent (described in Japanese Patent Provisional Publication Nos. 62(1987)-251740, 3(1991)-208514), an anionic surface active agent, a cationic surface active agent (described in Japanese Patent Provisional Publication No. 2(1990)-195356), an amphoteric surface active agent (described in Japanese Patent Provisional Publication Nos. 59(1984)-121044, 4(1992)-13149) and a fluorine surface active agent.

The image-forming layer contains the hydrophilic compound of a low molecular weight preferably in an amount of 0.05 to 15 wt. %, and more preferably in an amount of 0.1 to 5 wt. %.

[Polymerizable Compound]

The polymerizable compound can be in the form of a polymer, which is a cross-linkable polymer having a polymerizable group as a cross-likable functional group.

The polymerizable compound preferably has two or more polymerizable functional groups.

The polymerizable functional group can be reacted by heat to be polymerized. A heat-sensitive precursor of a compound accelerating the polymerization reaction (e.g., acid) can be used in combination with a polymerizable compound (e.g., a vinyl ether or a cyclic ether). Further, a thermal polymerization initiator (a radical precursor) can be used in combination with a polymerizable compound (ethylenically unsaturated polymerizable compound).

The combination of the heat-sensitive acid precursor and the vinyl ether or the cyclic ether is described in Japanese Patent Provisional Publication No. 2001-277740, 2002-46361 and 2002-29162.

The combination of the thermal polymerization initiator (a thermal radical precursor) and the ethylenically unsaturated polymerizable compound is described in Japanese Patent Provisional Publication No. 2002-137562.

The cyclic ether preferably is a compound having a three-membered epoxy group. The compound preferably has two or more cyclic ether groups. A commercially available epoxy compound or epoxy resin can be used as the polymerizable compound.

The vinyl ether preferably has two or more vinyl ether groups. The vinyl ether is preferably represented by the formula (XI).

$$L^4(\text{—O—CR}^5\text{=CR}^6R^7)_m \quad \text{(XI)}$$

In the formula (XI), $L^4$ is an m-valent linking group, and m is an integer of 2 or more. Each of $R^5$, $R^6$ and $R^7$ independently is hydrogen, a halogen atom, an alkyl group or an aryl group.

In the case that m is 2, $L^4$ preferably is a divalent linking group selected from the group consisting of an alkylene group, a substituted alkylene group, an arylene group, a substituted arylene group, a divalent heterocyclic group, —O—, —S—, —NH—, —CO—, —SO—, $\text{—SO}_2\text{—}$ and a combination thereof.

The alkylene group and the alkylene moiety of the substituted alkylene group can have a cyclic or branched structure. The alkylene group and the alkylene moiety of the substituted alkylene group preferably have 1 to 20 carbon atoms, more preferably has 1 to 15 carbon atoms, further preferably has 1 to 10 carbon atoms, and most preferably has 1 to 8 carbon atoms.

Examples of the substituent groups of the substituted alkylene group include a halogen atom, an aryl group, a substituted aryl group and an alkoxy group.

The arylene group and the arylene moiety of the substituted arylene group preferably is phenylene, and more preferably is p-phenylene.

The divalent heterocyclic group can have a substituent group.

Examples of the substituent groups of the substituted arylene group, the substituted aryl group and the substituted heterocyclic group include a halogen atom, an alkyl group, a substituted alkyl group, an aryl group, a substituted aryl group and an alkoxy group.

Examples of the substituent groups of the substituted alkyl group are the same as the examples of the substituent groups of the substituted alkylene group.

In the case the m is 3 or more, $L^4$ preferably is a trivalent or more aliphatic group, a trivalent or more aromatic group, a trivalent or more heterocyclic group, or a combination of a trivalent or more aliphatic group, a trivalent or more aromatic group or a trivalent or more heterocyclic group with an alkylene group, a substituted alkylene group, an arylene group, a substituted arylene group, a divalent heterocyclic group, —O—, —S—, —NH—, —CO—, —SO— or $\text{—SO}_2\text{—}$.

The trivalent or more aliphatic group can have a cyclic or branched structure. The aliphatic preferably has 1 to 20 carbon atoms, more preferably has 1 to 15 carbon atoms, further preferably has 1 to 10 carbon atoms, and most preferably has 1 to 8 carbon atoms.

The aliphatic group can have a substituent group. Examples of the substituent groups include a halogen atom, an aryl group, a substituted aryl group and an alkoxy group.

The aromatic group preferably is a residue (a radical) of benzene ring. The aromatic group can have a substituent group. Examples of the substituent groups include a halogen atom, an alkyl group, a substituted alkyl group, an aryl group, a substituted aryl group and an alkoxy group.

The heterocyclic group can have a substituent group. Examples of the substituent groups include a halogen atom, an alkyl group, a substituted alkyl group, an aryl group, a substituted aryl group and an alkoxy group.

$L^4$ can form a main chain of a polymer comprising repeating units, in which m is a number of the repeating units.

Each of $R^5$, $R^6$ and $R^7$ preferably is hydrogen, a halogen atom or an alkyl group, more preferably is hydrogen, a halogen atom or an alkyl group having 1 to 6 carbon atoms, further preferably is hydrogen or an alkyl group having 1 to 3 carbon atoms, furthermore preferably is hydrogen or methyl, and most preferably is hydrogen.

The ethylenically unsaturated polymerizable compound preferably has two or more ethylenically unsaturated groups. The ethylenically unsaturated polymerizable compound is preferably represented by the formula (XII).

$$L^4(—CR^5{=}CR^6R^7)_m \qquad \text{(XII)}$$

In the formula (XII), $L^4$ is an m-valent linking group, and p is an integer of 2 or more. Each of $R^5$, $R^6$ and $R^7$ independently is hydrogen, a halogen atom, an alkyl group or an aryl group.

The definitions and examples of $L^4$, m, $R^5$, $R^6$ and $R^7$ are the same as $L^4$, m, $R^5$, $R^6$ and $R^7$ in the formula (XI).

Two or more polymerizable compounds can be used in combination.

The polymerizable compound is contained in the image-forming layer preferably in an amount of 5 to 80 wt. %, and more preferably in an amount of 25 to 75 wt. %.

[Heat-Sensitive Acid Precursor]

In the case that a polymerizable compound has a functional group for a cationic polymerization reaction (such as a vinyl ether or a cyclic ether), the image-forming layer preferably further comprises a heat-sensitive acid precursor.

The heat-sensitive acid precursor is a compound capable of releasing an acid when the compound is heated. The formed acid can initiate or accelerate a polymerization reaction of a vinyl ether or a cyclic ether.

The heat-sensitive acid precursor preferably is an onium salt.

Examples of the heat-sensitive acid precursors include a diazonium salt (described in S. I. Schlesinger, Photogr. Sci. Eng., 18, 387 (1974), and T. S. Bal et al, Polymer, 21, 423 (1980)), an ammonium salt (described in U.S. Pat. Nos. 4,069,055, 4,069,056, Reissued U.S. Pat. No. 27,992 and Japanese Patent Provisional Publication No. 4(1992)-365049), a phosphonium salt (described in D. C. Necker et al, Macromolecules, 17, 2468 (1984), C. S. Wen et al, Teh, Proc. Conf. Rad, Curing ASIA, p478 Tokyo, October (1988), U.S. Pat. Nos. 4,069,055 and 4,069,056), an iodonium salt (described in J. V. Crivello et al, Macromorecules, 10(6), 1307 (1977), Chem. & Eng. News, November 28, p31 (1988), European Patent No. 104142, U.S. Pat. Nos. 4,339,049, 4,410,201, and Japanese Patent Provisional Publication Nos. 2(1990)-150848 and 2(1990)-296514), a sulfonium salt (J. V. Crivello et al, Polymer J. 17, 73 (1985), J. V. Crivello et al, J. Org. Chem., 43, 3055 (1978), W. R. Watt et al, J. Polymer Sci., Polymer Chem. Ed., 22, 1789 (1984), J. V. Crivello et al, Polymer Bull., 14, 279 (1985), J. V. Crivello et al, Macromolecules, 14(5), 1141 (1981), J. V. Crivello et al, J. Polymer Sci., Polymer Chem. Ed., 17, 2877 (1979), European Patent Nos. 370693, 390214, 233567, 297443, 297442, U.S. Pat. Nos. 4,933,377, 4,161,811, 4,410,201, 4,339,049, 4,760,013, 4,734,444, 2,833,827, German Paten Nos. 2,904,626, 3,604,580 and 3,604,581), a selenonium salt (described in J. V. Crivello et al, Macromolecules, 10(6), 1307 (1977), J. V. Crivello et al, J. Polymer Sci., Polymer Chem. Ed., 17, 1047 (1979) and an arsonium salt (described in C. S. Wen et al, Teh, Proc. Conf. Rad. Curing ASIA, p478 Tokyo, October (1988)).

Examples of counter anions of the onium salts include $BF_4^-$, $PF_6^-$, $AsF_6^-$ and $SbF_6^-$.

Two or more heat-sensitive acid precursors can be used in combination.

The heat-sensitive acid precursor is used preferably in an amount of 0.01 to 20 wt. %, and more preferably in an amount of 0.1 to 10 wt. % based on the total solid amount of the image-forming layer.

The heat-sensitive acid precursor can be contained in microcapsules. In the case that the heat-sensitive acid precursor is contained in the microcapsules, the heat-sensitive acid precursor is preferably not soluble in water. In the case that the heat-sensitive acid precursor is arranged outside the microcapsules, the heat-sensitive acid precursor is preferably soluble in water.

[Thermal Polymerization Initiator]

In the case that a polymerizable compound has a functional group for a radical polymerization reaction (such as an ethylenically unsaturated polymerizable compound), the image-forming layer preferably further comprises a thermal polymerization initiator.

The thermal polymerization initiator is a compound that releases a radical by a thermal energy to initiate or accelerate a polymerization of a compound having an unsaturated polymerizable group. Examples of the thermal polymerization initiators include an onium salt, a triazine compound having a trihalomethyl group, a peroxide, an azo compound, an azido compound, a quinone diazido compound and a metallocene compound. An onium salt (e.g., diazonium salt, iodonium salt, sulfonium salt, ammonium salt, pyridinium salt) is preferred, an iodonium salt, a diazonium salt and a sulfonium salt are more preferred.

Two or more thermal polymerization initiators can be used in combination.

The thermal polymerization initiator (thermal radical precursor) is described in Japanese Patent Provisional Publication No. 2002-137562.

The thermal polymerization initiator is used preferably in an amount of 0.1 to 50 wt. %, and more preferably in an amount of 0.5 to 30 wt. %, and most preferably in an amount of 1 to 20 wt. % based on the total solid amount of the image-forming layer.

The thermal polymerization initiator can be contained in microcapsules. In the case that the thermal polymerization initiator is contained in the microcapsules, the thermal polymerization initiator is preferably not soluble in water. In the case that the thermal polymerization initiator is arranged outside the microcapsules, the thermal polymerization initiator is preferably soluble in water.

[Microcapsule]

Microcapsules can be dispersed in the image-forming layer. The microcapsules can contain the polymerizable compound.

The microcapsules can be prepared according to a coacervation method (describe in U.S. Pat. Nos. 2,800,457, 2,800,458), an interfacial polymerization method (described in U.S. Pat. No. 3,287,154, Japanese Patent Publication No. 38(1963)-19574, 42(1967)-446), a polymer precipitation method (described in U.S. Pat. Nos. 3,418,250, 3,660,304), a method using isocyanate-polyol as wall material (described in U.S. Pat. No. 3,796,669), a method using isocyanate as wall material (described in U.S. Pat. No. 3,914,511), a method using urea-formaldehyde or urea-formaldehyde-resorcinol as wall material (described in U.S. Pat. Nos. 4,001,140, 4,087,376, 4,089,802), a method using melamine-formaldehyde resin or hydroxycellulose as wall material (described in U.S. Pat. No. 4,025,445), an in situ method of monomer polymerization (described in Japanese Patent Publication Nos. 36(1961)-9163, 51(1976)-9079), a spray drying method (described in British Patent No. 930, 422, U.S. Pat. No., 3,111,407) and an electrophoresis dispersion cooling method (described in British Patent Nos. 952,807, 967,074).

The microcapsule shell preferably has a three-dimensional cross-linking, which can be swelled with a solvent. The microcapsule shell preferably comprises a polyurea, a polyurethane, a polyester, a polycarbonate, a polyamide, a copolymer thereof or a mixture thereof. The shell more preferably comprises a polyurea, a polyurethane, a copolymer thereof or a mixture thereof. The polyurea and the polyurethane are particularly preferred. A hydrophobic polymer can be used as the microcapsule shell.

The microcapsules have an average particle size preferably in the range of 0.01 to 20 μm, more preferably in the range of 0.05 to 2.0 μm, and most preferably in the range of 0.10 to 1.0 μm.

The microcapsules can be fused with heat. The contents of the microcapsules can ooze out or into the shell of the microcapsules in preparation of the presensitized lithographic plate. The contents of the microcapsules can be reacted with a hydrophilic resin or a low molecular weight compound contained in the image-forming layer.

Two or more different microcapsules can be contained in the image-forming layer.

The microcapsules are contained in the image-forming layer preferably in an amount of 10 to 80 wt. %, and more preferably in an amount of 15 to 60 wt. % based on the total solid contents of the image-forming layer.

In preparation of the microcapsules, a solvent is added to microcapsule dispersion. The solvent preferably swells the microcapsule shell as well as dissolves the contents of the microcapsules. The solvent having a function of swelling the microcapsule shell can accelerate diffusion of the contents into outside the microcapsules.

Examples of the solvents include an alcohol (e.g., methanol, ethanol, propanol, t-butanol), an ether (e.g., tetrahydrofuran, propylene glycol monomethyl ether, ethylene glycol diethyl ether, ethylene glycol monomethyl ether), acetal, an ester (e.g., methyl lactate, ethyl lactate, γ-butyllactone), a ketone (e.g., methyl ethyl ketone), a glycol, a polyol, an amide (e.g., dimethylfomamide, N,N-dimetylacetamide), an amine and an fatty acid. Two or more solvents can be used in combination.

The solvent is contained in the coating solution of the image-forming layer preferably in an amount of 5 to 95 wt. %, more preferably in an amount of 10 to 90 wt. %, and most preferably in an amount of 15 to 85 wt. %.

[Polymer Having Hydrophilic Group Convertible to Hydrophobic Group]

The image-forming layer of the first and third embodiments can contain a hydrophilic polymer having a hydrophilic group that can be converted to a hydrophobic group when the image-forming layer is heated.

For example, a hydrophilic carboxyl group can be changed to a hydrophobic hydrocarbon group by heating a hydrophilic polymer having a carboxyl group that can be decarboxylated.

The carboxylic acids that can be decarboxylated include a sulfonylacetic acid, a propionic acid and a dichloroacetic acid. Therefore, the carboxyl groups that can be decarboxylated include carboxymethanesulfonyl group ($-SO_2-CH_2-COOH$), carboxyethynyl ($-C{\equiv}C-COOH$) and carboxyldichloromethyl ($-CCl_2-COOH$). The carboxymethanesulfonyl group derived from the sulfonylacetic acid is particularly preferred. Proton can be dissociated from the carboxyl group. The carboxyl group can form a salt with a cation.

The two hydrogen atoms contained in the carboxymethanesulfonyl group can be substituted. Examples of the substituent groups are the same as the substituent groups of the aliphatic group (described above).

The sulfonyl group ($-SO_2-$) of the carboxymethanesulfonyl group can be replaced with sulfinyl group ($-SO-$), carbonyl group ($-CO-$), sulfur atom ($-S-$), oxygen atom ($-O-$) or imino group ($-NH-$). The carboxyl groups formed by the above-mentioned replacement can also be changed to a hydrophobic hydrocarbon group by heating.

A sulfonic or phosphoric acid group can also be changed to a hydrophobic hydrocarbon group by heating.

The hydrophilic group convertible to a hydrophobic group is preferably contained in a side chain rather than a main chain of the polymer. The hydrophilic group is more preferably placed at the end of the side chain. The side chain, namely the linking group between the hydrophilic group and the main chain preferably is a divalent group selected from the group consisting of an alkylene group, a substituted alkylene group, an arylene group, a substituted arylene group, a divalent heterocyclic group, $-O-$, $-S-$, $-NH-$, $-CO-$, $-SO-$, $-SO_2-$ and a combination thereof. The definition and examples of the alkylene group, the substituted alkylene group, the arylene group, the substituted arylene group and the divalent heterocyclic group are the same as those of the linking group of the above-mentioned polymerizable compound.

In the third embodiment, the hydrophilic group convertible to a hydrophobic group is preferably cross-linked or used in combination with a cross-linked polymer. The cross-linking reaction is described below about the cross-linking polymer.

The main chain of the polymer preferably is hydrocarbon (polyolefin), polyester, polyamide, polyimide, polyurea, polyurethane, polyether of a combination thereof. The hydrocarbon chain is particularly preferred.

The main chain of the polymer can have a substituent group other than the hydrophilic group convertible to a hydrophobic group. Examples of the substituent groups are the same as those of the substituent groups of the thermally fusible polymer.

The image-forming layer contains a hydrophilic polymer having a hydrophilic group convertible to a hydrophobic group preferably in an amount of 10 to 99 wt. %, and more preferably in an amount of 10 to 95 wt. %.

[Polymer Having Hydrophobic Group Convertible to Hydrophilic Group]

The image-forming layer of the second and fourth embodiments can contain a hydrophobic polymer having a hydrophobic group that can be converted to a hydrophilic group when the image-forming layer is heated.

For example, a sulfonimido, disulfone or sulfonate ester group can be changed to a sulfo group, which is strongly hydrophilic, by heating a hydrophobic polymer having the sulfonimidok, disulfone or sulfonate ester group.

Each of the sulfonimido, disulfone and sulfonate ester groups is a divalent or trivalent functional group, which can be placed at a main chain or a side chain of the polymer.

The hydrophobic group convertible to a hydrophilic group is preferably contained in a side chain rather than a main chain of the polymer. The hydrophobic group is more preferably placed at the end of the side chain. The hydrophobic group convertible to a hydrophilic group preferably is $—SO_2—NR—SO_2—R$, $—SO_2—N(—SO_2—R)_2$, $—SO_2—SO_2—R$, $—SO_2—O—R$ or $—O—SO_2—R$. R is an aliphatic group, an aromatic group or a heterocyclic group.

The side chain, namely the linking group between the hydrophobic group and the main chain preferably is a divalent group selected from the group consisting of an alkylene group, a substituted alkylene group, an arylene group, a substituted arylene group, a divalent heterocyclic group, —O—, —S—, —NH—, —CO—, —SO—, $—SO_2—$ and a combination thereof. The definition and examples of the alkylene group, the substituted alkylene group, the arylene group, the substituted arylene group and the divalent heterocyclic group are the same as those of the linking group of the above-mentioned polymerizable compound.

In the fourth embodiment, the hydrophobic group convertible to a hydrophilic group is preferably cross-linked or used in combination with a cross-linked polymer. The cross-linking reaction is described below about the cross-linking polymer.

The main chain of the polymer preferably is hydrocarbon (polyolefin), polyester, polyamide, polyimide, polyurea, polyurethane, polyether of a combination thereof. The hydrocarbon chain is particularly preferred.

The main chain of the polymer can have a substituent group other than the hydrophilic group convertible to a hydrophobic group. Examples of the substituent groups are the same as those of the substituent groups of the thermally fusible polymer.

The image-forming layer contains a hydrophobic polymer having a hydrophobic group convertible to a hydrophilic group preferably in an amount of 10 to 99 wt. %, and more preferably in an amount of 20 to 95 wt. %.

[Cross-Linked Polymer]

The image-forming layer of the third and fourth embodiments preferably contains a cross-linked polymer to obtain plate wear. It is very difficult (substantially impossible) to form an image-forming layer uniformly containing a cross-linked polymer where the polymer has already been cross-linked before forming the image-forming layer (for example, the polymer has been cross-linked in a coating solution of the layer). Therefore, the polymer is preferably cross-linked after forming the image-forming layer (for example, after coating the coating solution of the layer).

A cross-linkable polymer and a cross-linking agent (a photo initiator or a thermal initiator) can be added to a coating solution of the image-forming layer. The polymer can be cross-linked by the function of the cross-linking agent after coating the coating solution to form the image-forming layer and irradiating light to the layer or heating the layer. The polymer is preferably cross-linked without need of outer energy (light or heat). Accordingly, the polymer is preferably cross-linked by a cross-linking agent that does not require outer energy.

The cross-linking agent that does not require outer energy preferably is an hydroxide or an alkoxide compound of silicon (Si), aluminum (Al), titanium (Ti) or zirconium (Zr).

The cross-linking agent is preferably represented by the formula (XIII).

$$(R^9O—)_{p-q}M(—R^{10})_q \qquad \text{(XIII)}$$

In the formula, M is silicon (Si), aluminum (Al), titanium (Ti) or Zirconium (Zr); p is 3 or 4 when M is aluminum, p is 4 when M is silicon, titanium or zirconium; q is 0, 1 or 2; each of $R^9$ and $R^{10}$ independently is hydrogen, an aliphatic group or an aromatic group. The aliphatic group and the aromatic group are described above. The aliphatic group preferably has 1 to 4 carbon atoms.

The compound represented by the formula (XIII) preferably has a molecular weight of not more than 1,000.

Examples of the alkoxide compounds of silicon include trimethoxysilane, triethoxysilane, tripropoxysilane, tetramethoxysilane, tetraethoxysilane, tetrapropoxysilane, methyltrimethoxysilane, ethyltrimethoxysilane, propyltrimethoxysilane, methyltriethoxysilane, ethyltriethoxysilane, propyltriethoxysilane, dimethyldimethoxysilane, diethyldimethoxysilane, 3-chloropropyltriethoxysilane, 3-mercaptopropyltrimethoxysilane, 3-mercaptopropyltriethoxysilane, 3-aminopropyltriethoxysilane, phenyltrimethoxysilane, phenyltriethoxysilane, phenyltripropoxysilane, diphenyldimethoxysilane and diphenyldiethoxysilane.

Examples of the alkoxide compounds of aluminum include trimethoxyaluminate, tripropoxyaluminate and tetraethoxyalminate.

Examples of the alkoxide compounds of titanium include trimethoxytitanate, tetramethoxytitanate, triethoxytitanate, tetraethoxytitanate, tetrapropoxytitanate, chlorotrimethoxytitanate, chlorotriethoxytitanate, ehtyltrimethoxytitanate, methyltriethoxytitanate, ethyltriethoxytitanate, diethyldiethoxytitanate, phenyltrimethoxytitanate and phenyltriethoxytitanate.

Examples of the alkoxide compounds of zirconium include trimethoxyzirconate, tetramethoxyzirconate, triethoxyzirconate, tetraethoxyzirconate, tetrapropoxyzirconate, chlorotrimethoxyzirconate, chlorotriethoxyzirconate, ehtyltrimethoxyzirconate, methyltriethoxyzirconate, ethyltriethoxyzirconate, diethyldiethoxyzirconate, phenyltrimethoxyzirconate and phenyltriethoxyzirconate.

The cross-linking agent is used preferably in an amount of 0.05 to 60 wt. %, and more preferably in an amount of 0.1 to 30 wt. % based on the amount of the polymer.

The polymer preferably has a functional group that can be cross-linked by the cross-linking agent. The functional group is determined depending on the cross-linking agent. In the case that the cross-linking agent is a thermal polymerization initiator or a photo polymerization initiator, the polymer preferably has an ethylenically unsaturated bond as the functional group that can be cross-linked by the cross-linking agent. In the case that the cross-linking agent is a heat-sensitive acid precursor, the polymer preferably has a vinyl ether or a cyclic ether as the functional group that can be cross-linked by the cross-linking agent.

The cross-linking agent preferably is a hydroxide or an alkoxide compound of silicon, aluminum, titanium or zirconium, as is mentioned above. Therefore, the polymer preferably has a functional group that can be cross-linked by a hydroxide or an alkoxide compound of silicon, aluminum, titanium or zirconium.

The functional group can be placed at an end of the polymer or a side chain of the polymer.

The functional group is preferably represented by the formula (XIV).

$$(R^{71}\text{-})_m(R^{72}O)_{3-m}Si\text{—} \quad \text{(XIV)}$$

In the formula, each of $R^{71}$ and $R^{72}$ independently is hydrogen, an aliphatic group having 1 to 8 carbon atoms, or a aromatic group having 6 to 8 carbon atoms; m is 0, 1 or 2; when m is 2, two groups represented by $R^{71}$ can be different from each other; and when m is 0 or 1, three or two groups represented by $R^{72}$ can be different from each other.

The polymer can be a copolymer comprising repeating units having a functional group that can be cross-linked by the cross-linking agent and repeating units having such a functional group. The ratio of the repeating units (units having a functional group per units having no functional group) is preferably in the range of 1/99 to 99/1, and more preferably in the range of 30/70 to 90/10 in terms of the weight ratio of the monomers corresponding to the repeating units.

The main chain of the polymer preferably is hydrocarbon (polyolefin), polyester, polyamide, polyimide, polyurea, polyurethane, polyether or a combination thereof. The main chain particularly preferably is hydrocarbon.

The main chain can have a substituent group other than the functional group that can be cross-lined by the cross-linking agent. Examples of the substituent groups are the same as those of the substituent groups of the thermally fusible polymer.

The image-forming layer contains the cross-linked polymer preferably in an amount of 10 to 99 wt. %, and more preferably in an amount of 20 to 95 wt. %.

[Ink-Receiving Layer]

The ink-receiving layer contains an organic polymer. The organic polymer preferably can form a hydrophilic membrane soluble in a solvent. The polymer more preferably is not soluble in a solvent of a hydrophilic layer provided on the ink-receiving layer. In some case, the polymer is preferably swelled with (not dissolved in) the solvent of the hydrophilic layer to improve adhesion between the ink-receiving layer and the hydrophilic layer. The polymer soluble in the solvent of the hydrophilic layer is preferably cross-linked to harden the ink-receiving layer by using a cross-linking agent.

Examples of the organic polymers include polyether, polyurethane, polyurea, polyimide, polysiloxane, polycarbonate, phenoxy resin, epoxy resin, novolak resin, resol resin, condensed resin of phenyl compound and acetone, polyvinyl acetate, acryl resin or a copolymer thereof, polyvinyl phenol, halogenated polyvinyl phenol, methacrylic resin or a copolymer thereof, acrylamide or a copolymer thereof, methacrylamide or a copolymer thereof, polyvinyl formal, polyamide, polyvinyl butyral, polystyrene, cellulose ester resin, polyvinyl chloride and polyvinylidene chloride.

The polymer preferably has a side chain containing a functional group such as hydroxyl, carboxyl, sulfonamide or trialkoxysilyl. The functional group has an affinity to the support or the hydrophilic layer. The functional group can also be hardened by using a cross-linking agent.

Polyacrylonitrile or a copolymer thereof, polyurethane, a polymer having a side chain containing sulfoamido or hydroxyl group can be cross-linked by light exposure in the presence of a diazo resin to be used as the polymer of the ink-receiving layer.

The epoxy resin preferably is a polyaddition product of epichlorohydrin with bisphenol A, bisphenol F, halogenated bisphenol A, bisphenol of biphenyl type or a novolak resin. The commercially available epoxy resins include Epicoat 1001 (softening point: 68° C., Mn: about 900), Epicoat 1007 (softening point: 128° C., Mn: about 2,900), Epicoat 1009 (softening point: 144° C., Mn: about 3,750), Epicoat 1010 (softening point: 169° C., Mn: about 5,500), Epicoat 1100L (softening point: 149° C.), and Epicoat YX31575 (softening point: 130° C.) of Japan Epoxy Resin Co., Ltd.

The novolak or resol resins include an addition condensation product of a phenol with an aldehyde (e.g., formaldehyde, paraformaldehyde). Examples of the phenols include phenol, cresol (e.g., m-cresol, p-cresol, a mixture thereof), a mixture of phenol and cresol, xylene denatured with phenol, t-butylphenol, octylphenol, resorcinol, pyrogallol, catechol, chlorophenol (e.g., m-chlorophenol, p-chlorophenol), bromophenol (e.g., m-bromophenol, p-bromophenol), salicylic acid and phloroglucinol.

The other preferred polymers can be obtained by polymerizing the following monomers classified into the groups (1) to (12). The polymer preferably has an average molecular weight of 10,000 to 120,000.

(1) Acrylic Monomers Having Aromatic Hydroxyl Group and Hydroxylstyrenes

The acrylic monomers include acrylamide (e.g., N-(4-hydroxyphenyl)acrylamide), methacrylamide (e.g., N-(4-hydroxyphenyl)methacrylamide), acrylate ester (e.g., o-, m- or p-hydroxyphenyl acrylate) and methacrylate ester (e.g., o-, m- or p-hydroxyphenyl methacrylate).

The hydroxystyrenes include o-, m- or p-hydroxystyrene.

(2) Acrylate or Methacrylate Esters Having an Aliphatic Hydroxyl Group

Examples of the esters include 2-hydroxyethyl acrylate and 2-hydroxyethyl methacrylate.]

(3) Acrylate Esters

Examples of the acrylate esters include methyl acrylate, ethyl acrylate, propyl acrylate, butyl acrylate, pentyl acrylate, hexyl acrylate, cyclohexyl acrylate, octyl acrylate, phenyl acrylate, benzyl acrylate, 2-chloroethyl acrylate, 4-hydroxybutyl acrylate, glycidyl acrylate, N,N-dimethylaminoethyl acrylate.

(4) Methacrylate Esters

Examples of the methacrylate esters include methyl methacrylate, ethyl methacrylate, propyl methacrylate, butyl methacrylate, pentyl methacrylate, hexyl methacrylate, cyclohexyl methacrylate, octyl methacrylate, phenyl methacrylate, benzyl methacrylate, 2-chloroethyl methacrylate, 4-hydroxybutyl methacrylate, glycidyl methacrylate, N,N-dimethylaminoethyl methacrylate.

(5) (Meth)acrylamides

Examples of the (meth)acrylamides includes acrylamide, methacrylamide, N-methylolacrylamide, N-methylolmethacrylamide, N-ethylacrylamide, N-ethylmethacrylamide, N-hexylacrylamide, N-hexylmethacrylamide, N-cyclohexylacrylamide, N-cyclohexylmethacrylamide, N-hydroxyethylacrylamide, N-hydroxyethylmethacrylamide, N-phenylacrylamide, N-phenylmethacrylamide, N-benzylacrylamide, N-benzylmethacrylamide, N-nitrophenylacrylamide, N-nitrphenylmethacrylamide, N-ethyl-N-phenylacrylamide and N-ethyl-N-phenylmethacrylamide.

(6) Vinyl Ethers

Examples of the vinyl ethers include ethyl vinyl ether, 2-chloroethyl vinyl ether, hydroxyethyl vinyl ether, propyl vinyl ether, butyl vinyl ether, octyl vinyl ether and phenyl vinyl ether.

(7) Vinyl Esters

Examples of the vinyl ethers include vinyl acetate, vinyl chloroacetate, vinyl butyrate and vinyl benzoate.

(8) Styrenes

Examples of the styrenes include styrene, methyl styrene and chloromethylstyrene.

(9) Vinyl Ketones

Examples of the vinyl ketones include methyl vinyl ketone, ethyl vinyl ketone, propyl vinyl ketone and phenyl vinyl ketone.

(10) Olefins

Examples of the olefins include ethylene, propylene, isobutylene, butadiene and isoprene.

(11) Vinyl heterocyclic Compounds and (Meth)acrylonitriles

Examples of the vinyl heterocyclic compounds include N-vinylpyrrolidone, N-vinylcarbazole and N-vinylpyridine.

Examples of the (meth)acrylonitriles include acrylonitrile and methacrylonitrile.

(12) (Meth)acrylamides or (Meth)acrylate Esters Having Sulfonamido Group.

Examples of the acrylamides having sulfoamido group include N-(o-sulfamoylphenyl)acrylamide, N-(m-sulfamoylphenyl)acrylamide, N-(p-sulfamoylphenyl)acrylamide, N-[1-(3-sulfamoylethyl)naphthyl]acrylamide and N-(2-sulfamoylethyl)acrylamide.

Examples of the methacrylamides having sulfoamido group include N-(o-sulfamoylphenyl)methacrylamide, N-(m-sulfamoylphenyl)methacrylamide, N-(p-sulfamoylphenyl)methacrylamide, N-[1-(3-sulfamoylethyl)naphthyl]methacrylamide and N-(2-sulfamoylethyl)methacrylamide.

Examples of the acrylate esters having sulfonamido group include o-sulfamoylphenyl acrylate, m-sulfamoylphenyl acrylate, p-sulfamoylphenyl acrylate and 1-(3-sulfamoylphenynaphthyl)acrylate.

Examples of the methacrylate esters having sulfonamido group include o-sulfamoylphenyl methacrylate, m-sulfamoylphenyl methacrylate, p-sulfamoylphenyl methacrylate and 1-(3-sulfamoylphenynaphthyl) methacrylate.

The polymer can be dissolved in a solvent to prepare a coating solution. The coating solution can be coated on a support to form an ink-receiving layer. A cross-linking agent, an adhesive, a coloring agent, a coating aid or a plasticizer can be added to the coating solution. The printing out agent can also be added to the ink-receiving layer.

The cross-linking agents include a diazo resin, an aromatic azido compound, an epoxy resin, an isocyanate compound, a blocked isocyanate compound, an initial hydrolysis condensation product of tetraalkoxysilane, glyoxal, an aldehyde compound and amethylol compound.

The diazo resin can also function as an adhesive. The diazo resin has a function of improving adhesion between the support and a hydrophilic layer. A silane coupling agent, an isocyanate compound and a titanium coupling agent can also be used as the adhesive.

A conventional dye or pigment can be used as the coloring agent. Examples of the preferred coloring agents include Rhodamine 6G chloride, Rhodamine B chloride, Crystal Violet, Malachite Green (oxalate salt), quinizarin, 2-(α-naphthyl)-5-phneyloxazole. The other dyes include triphenylmethane dyes, diphenylmethane dyes, oxazine dyes, xanthene dyes, isonaphthoquinone dyes, azomethine dyes and anthraquinone dyes. Examples of the other dyes include Oil Yellow #101, Oil Yellow #103, Oil Pink #312, Oil Green BG, Oil Blue BOS, Oil Blue #603, Oil Black BY, Oil Black BS, Oil Black T-505 (Orient Chemical Industries); Victoria Pure Blue, Crystal Violet (C.I.: 42555), Methyl Violet (C.I.: 42535), Ethyl Violet, Methylene Blue (C.I.: 52015), Patent Pure Blue (Sumitomo Mikuni Chemicals); Brilliant Blue, Methyl Green, Erythrycyn B, Basic Fukucyn, m-Cresol Purple, Auramine, 4-p-diethylaminophenyliminaphthoquinone and cyano-p-diethylaminophhenylacetoanilide. The other dyes are described in Japanese Patent Provisional Publication NOS. 62(1987)-293247 and 9(1997)-179290.

The coloring agent is contained in the ink-receiving layer preferably in an amount of 0.01 to 10 wt. %, and more preferably in an amount of 0.1 to 5 wt. % based on the solid content of the ink-receiving layer.

A fluorine or silicone surface active agent can be used as the coating aid. The surface active agent preferably has a perfluoroalkyl group or a dimethylsiloxane group.

A plasticizer can be added to the ink-receiving layer to soften the coated layer. Examples of the plasticizers include polyethylene glycol, tributyl citrate, diethyl phthalate, dibutyl phthalate, dihexyl phthalate, dioxtyl phthalate, tricresyl phosphate, tributyl phosphate, trioctyl phosphate, tetrahydrofurfuryl oleate and oligomers or polymers of acrylic or methacrylic acid.

The solvents of the ink-receiving layers include an alcohol (e.g., methanol, ethanol, propanol, ethylene glycol, diethylene glycol, propylene glycol, dipropylene glycol, ethylene glycol monomethyl ether, propylene glycol monomethyl ether, ethylene glycol monoethyl ether), an ether (e.g., tetrahydrofuran, ethylene glycol dimethyl ether, propylene glycol dimethyl ether, tetrahydropyran), a ketone (e.g., acetone, methyl ethyl ketone, acetylacetone), an ester (e.g., methyl acetate, ethyl acetate, ethylene glycol monomethyl ether monoacetate, γ-butyrolactone, methyl lactate, ethyl lactate) and an amide (e.g., formamide, N-methylformamide, pyrrolidone, N-methylpyrrolidone). Two or more solvents can be used in combination. The concentration (solid content including additives) of the ink-receiving layer is preferably in the range of 1 to 50 wt. %. The ink-receiving layer can also be formed by using an emulsion in place of the solution. The concentration of the emulsion is preferably in the range of 5 to 50 wt. %.

The dry coating amount of the ink receiving layer is preferably less than 0.5 $g/m^2$, more preferably in the range of 0.2 to 0.5 $g/m^2$, and most preferably in the range of 0.3 to 0.5 $g/m^2$.

The ink-receiving layer has a surface roughness in terms of center line average height (Ra) preferably in the range of 0.40 to 0.65 μm, more preferably in the range of 0.50 to 0.65 μm, and most preferably in the range of 0.50 to 0.60 μm. The surface roughness is adjusted as mentioned above to improve the plate wear.

[Hydrophilic Layer]

The hydrophilic layer can contain colloidal particles of oxide or hydroxide of an element, which is selected from the group consisting of beryllium, magnesium, aluminum, silicon, titanium, boron, germanium, tin, zirconium, iron, vanadium, antimony and transition metals.

The colloidal oxide or hydroxide particles can be prepared by hydrolysis of a halide or an alkoxy compound or condensation of hydroxide. A colloidal dispersion can be added to a coating solution of the hydrophilic layer.

The oxide or hydroxide of aluminum, silica, titanium or zirconium is preferred.

The colloidal silica particles have a particle size preferably of 5 to 100 nm, and more preferably of 10 to 50 nm. The particle preferably has a sphere shape. The particles can be connected to each other to form a shape of 50 to 400 nm like a pearl necklace. A colloidal particle of aluminum oxide or hydroxide has a shape of 100 nm×10 nm like a feather. A commercially available colloidal dispersion (Nissan Chemical Industries) can also be used.

The dispersing medium of the colloidal particles is water or an organic solvent such as methanol, ethanol, ethylene glycol monomethyl ether or methyl ethyl ketone.

The hydrophilic layer can contain a hydrophilic resin in addition to the colloidal particles. The hydrophilic resin has a function of enhancing the strength of the layer to improve plate wear. The hydrophilic resin is a polymer having a hydrophilic group, such as hydroxyl, carboxyl, hydroxyethtyl, hydroxypropyl, amino, aminoethyl, aminopropyl, carboxymethyl.

The hydrophilic resins include gum arabic, casein, gelatin, starch derivative, carboxymethylcellulose or a sodium salt thereof, cellulose acetate, sodium alginate, vinyl acetate-maleic acid copolymer, styrene-maleic acid copolymer, polyacrylic acid or a salt thereof, polymethacrylic acid or a salt thereof, polyhydroxyethyl methacrylate or a copolymer thereof, polyhydroxyethyl acrylate or a copolymer thereof, polyhydroxybutyl methacrylate or a copolymer thereof, polyhydroxybutyl acrylate or a copolymer thereof, polyethylene glycol, polypropylene oxide, polyvinyl alcohol, polyvinyl acetate or a partial (at least 60%, more preferably at least 80%) hydrolysis product thereof, polyvinyl formal, polyvinyl butyral, polyvinyl pyrrolidone, polyacrylamide or a copolymer thereof, polymethacrylamide or a copolymer thereof, poly(N-methylolacrylamide) or a copolymer thereof.

The hydrophilic layer contains the hydrophilic resin preferably in an amount of not more than 40 wt. %, and more preferably in an amount of not more than 20 wt. % based on the solid content of the hydrophilic layer.

The hydrophilic layer can contain a phenol resin. The phenol resin has a function of improving the strength of the layer. The phenol resin has another function of improving affinity to ink (particularly effective when a printing process is started). The phenol resin is preferably soluble in methanol at least 5 wt. % at 25° C. The phenol resin is also preferably soluble in an alkaline solution. Examples of the phenol resins include novolak resin, resol resin, polyvinyl phenol resin and ketone pyrogallol resin.

The novolak resin usually is an addition condensation product of a phenol resin with an aldehyde. The addition condensation reaction can be conducted in the presence of an acid catalyst. Examples of the phenols include phenol, o-cresol, m-cresol, p-cresol, 2,5-xylenol, 3,5-xyleno, resorcinol. Examples of the aldehydes include formaldehyde, acetaldehyde, propionaldehyde. Paraformalddehyde or paraacetaldehyde can be used in place of formaldehyde or acetaldehyde. The phenol preferably is a mixture of m-cresol:p-cresol:2,5-xylenol:3,5-xyleno:resorcinol at a molar ratio of 40 to 100:0 to 50:0 to 20:0 to 20:0 to 20. The phenol also preferably is a mixture of phenol:m-cresol:p-cresol at a molar ratio of 1 to 100:0 to 70:0 to 60. The aldehyde preferably is formaldehyde. The novolak resin has a weight average molecular weight preferably in the range of 1,000 to 15,000, and more preferably in the range of 1,500 to 10,000.

The resol resin usually is an addition condensation product of a phenol with an aldehyde or ketone. The addition condensation reaction can be conducted in the presence of an alkaline catalyst. Examples of the phenols include phenol, o-cresol, m-cresol, p-cresol, 2,5-xylenol, 3,5-xyleno, resorcinol, pyrogallol, bis(4-hydroxyphenyl)methane, bisphenol A, o-ethylphenol, m-ethylphenol, p-ethylphenol, propylphenol, butylphenol, t-butylphenol, 1-naphthol, 2-naphthol. Examples of the aldehydes include formaldehyde, acetaldehyde, propionaldehyde, benzaldehyde, furfural. Examples of the ketones include acetone, methyl ethyl ketone, methyl isobutyl ketone. Paraformalddehyde or paraacetaldehyde can be used in place of formaldehyde or acetaldehyde. The resol resin has a weight average molecular weight preferably in the range of 500 to 10,000, and more preferably in the range of 1,000 to 5,000.

The polyvinyl phenol resin preferably is a polymer of a hydroxystyrene such as o-hydroxystyrene, m-hydroxystyrene, p-hydroxystyrene, 2-(o-hydroxyphenyl)propylene, 2-(m-hydroxyphenyl)propylene, 2-(p-hydroxyphenyl)propylene. The aromatic ring of the hydroxystyrene can have a substituent group, such as a halogen atom (fluorine, chlorine, bromine, iodine), an alkyl group having 1 to 4 carbon atoms. The polymer can be a copolymer comprising two or more repeating units. The other repeating units can be derived from methacrylic acid, acrylic acid, an alkyl methacrylate or an alkyl acrylate. The polyvinyl phenol resin can be obtained by polymerizing hydroxyl styrene (which can have a substituent group) in the presence of a radical polymerization initiator or a cationic polymerization initiator. The polyvinyl phenol resin can be partially hydrogenised. The hydroxyl groups of the resin can be partially protected with t-butoxycarbonyl group, pyranyl group, or furanyl group. The polyvinyl phenol resin has a weight average molecular weight preferably in the range of 1,000 to 100,000, and more preferably in the range of 1,500 to 50,000.

The ketone pyrogallol resin preferably is an acetone pyrogallol resin.

The hydrophilic layer contains the phenol resin preferably in an amount of not more than 20 wt. %, and more preferably in an amount of not more than 12 wt. % based on the solid content of the hydrophilic layer.

The hydrophilic layer can contain a cross-linking agent, which accelerates a cross-linking reaction of a colloidal oxide or hydroxide. Examples of the cross-linking agents include an initial hydrolysis condensation product of tetraalkoxysilane, trialkoxysiliypropyl-N,N,N-trialkylammonium halide, and aminopropyltrialkoxysilane. The hydrophilic layer contains the cross-linking agent preferably in an amount of not more than 5 wt. % based on the solid content of the hydrophilic layer.

The hydrophilic layer can also contain another cross-linking agent, which causes a cross-linking reaction of the hydrophilic resin or the phenol resin to improve the plate wear. Examples of the cross-linking agents of the resins include formaldehyde, glyoxal, polyisocyanate, an initial hydrolysis condensation product of tetraalkoxysilane, dimehtylolurea, hexamethylolmelamine.

The hydrophilic layer can contain a surface active agent, such as a fluorine surface active agent, a silicon surface active agent or a polyoxyethylene surface active agent. The surface active agent can function as a coating aid.

The hydrophilic layer can be formed by dissolving or dispersing the above-mentioned components in a solvent to prepare a coating solution, and coating the solution on the ink-receiving layer. Examples of the solvents include water or a low-boiling point alcohol such as methanol, ethanol, propanol. Two or more solvents can be used in combination.

A solvent of dissolving the lipophilic polymer of the ink-receiving layer can be added to the coating solution of the hydrophilic layer to improve plate wear. Examples of the solvents of the liphophilic polymers include an alcohol (e.g., ethylene glycol monomethyl ether, propylene glycol monomethyl ether, ethylene glycol monoethyl ether), an ether (e.g., tetrahydrofuran, ethylene glycol dimethyl ether, propylene glycol dimethyl ether, tetrahydropyran), a ketone (e.g., acetone, methyl ethyl ketone, methyl isobutyl ketone, acetylacetone, cyclohexanone), an ester (e.g., methyl acetate, ethyl acetate, isobutyl acetate, ethylene glycol monomethyl monoacetate, methyl lactate, ethyl lactate), an amide (e.g., formamide, N-methyformamide, pyrrolidone, N-methyl pyrrolidone), γ-butyrolactone.

The hydrophilic layer contains a solvent of the lipophilic polymer preferably in an amount of 0.4 to 40 wt. %, and more preferably in an amount of 0.4 to 20 wt. %.

The dry coating amount of the hydrophilic layer is preferably in the range of 0.2 to 0.8 g/m$^2$, and more preferably in the range of 0.3 to 0.5 g/m$^2$. The coating amount is adjusted to obtain a function of keeping dampening water without degrading the on-press development or the sensitivity.

[Overcoating Layer Provided on Hydrophilic Layer]

A hydrophilic overcoating layer can be provided on the hydrophilic layer. The overcoating layer has a function of preventing abrasion dust from scattering. The layer has another function of protecting the hydrophilic layer from contamination cased by a lipophilic substance or finger print while storing or handling the lithographic plate.

The hydrophilic overcoating layer can be removed on a press machine. The hydrophilic overcoating layer can contain a water soluble resin or a resin that can be swelled with water, which can be obtained by partially cross-linking the water-soluble resin.

The water-soluble resin preferably is a natural or synthetic polymer. The water-soluble resin can be used in combination with a cross-linking agent to form a resin that can be swelled with water (namely cross-linked resin) after forming and drying the overcoating layer.

Examples of the natural polymers include gum arabic, water soluble soy bean polysaccharide, cellulose derivatives (e.g., carboxymethylcellulose, carboxyethylcellulose, methylcellulose), denatured cellulose, white dextrin, pullulan, enzyme decomposition product of dextrin ether. Examples of the synthetic polymers include polyvinyl alcohol (65% or more hydrolysis product of polyvinyl acetate), polyacrylic acid, an alkali metal or amine salt thereof, or a copolymer thereof, polymethacrylic acid, an alkali metal or amine salt thereof, or a copolymer thereof, vinyl alcohol/acrylic acid copolymer or an alkali metal or amine salt thereof, polyacrylamide or a copolymer thereof, polyhydroxyethyl acrylate, polyvinyl pyrrolidone or a copolymer thereof, polyvinyl methyl ether, vinyl methyl ether/maleic anhydride copolymer, poly(2-acrylamido-2-methyl-1-propanesulfonic) acid, an alkali metal or amine salt thereof. Two or more resins can be used in combination.

The water-soluble resin can be partially cross-linked. The cross-linking reaction can be caused by the functional group of the water-soluble resin. The cross-linking bond can be a covalent bond or an ionic bond.

The cross-linking reaction can decrease adhesiveness of the overcoating layer to improve handling the plate. If the cross-linking reaction extremely proceeds, the over-coating layer might be made lipophilic. It is difficult to remove lipophilic overcoating layer on a press machine. Therefore, the hydrophilic polymer should be partially cross-linked.

An appropriately partial cross-linking can be determined by immersing a presensitized lithographic plate in water at 25° C. The hydrophilic overcoating layer obtained by the appropriately partial cross-linking reaction is not dissolved in water for 30 seconds to 1 minute, but is dissolved in water after 10 minutes or more.

The cross-linking agent preferably is a polyfunctional compounds. The cross-linking agents include polyepoxy compound, polyisocyanate compound, polyalkoxysilyl compound, polyvalent metal salt, polyamine compound, an aldehyde compound, hydrazine. The cross-linking reaction can be accelerated by using a catalyst.

Examples of the polyepoxy compounds include glycerin polyglycidyl ether, polyethylene glycol diglycidyl ether, polypropylene glycol diglycidyl ether, trimethylolpropane polyglycidyl ether, sorbitol polyglycidyl ether, bisphenols, hydorogenated product thereof, polycondensation product with epihalohydrin.

Examples of the polyamine compounds include ethylenediamine diethylenetriamine, triethylenetetramine, tetraethylenepentamine, hexamethylenediamine, propylenediamine, polyethylenimine, polyamidoamine.

Examples of the isocyanate compounds include tolylene diisocyanate, diphenylmethane isocyanate, liquid diphenylmethane isocyanate, polymethylene polyphenyl isocyanate, xylene diisocyanate, naphthaline-1,5-diisocyanate, cyclohexane phenylene diisocyanate, isopropylbenzene-2,4-diisocyanate, hexamethylene diisocyanate, decamethylene diisocyanate, cyclohexyldiisocyanate, isophorone diisocyanate, addition product of polypropylene glycol with tolylene diisocyanate.

Examples of the silane compounds include methyltrimethoxysilane, methyltriethoxysilane, ethyltriethoxysilane, phenyltriethoxysilane, vinyltriethoxysilane, γ-aminopropyltriethoxysilane, N-(β-aminoethyl)-γ-aminopropyltrimethoxysilane, γ-glycidoxypropyltrimethoxysilane, γ-methacryloyloxypropyltrimethoxysilane, γ-mercaptopropyltrimethoxysilane, β-(3,4-epoxycyclohexyl)ethyltrimethoxsilane, dimethyldimethoxysilane, dimethyldiethoxysilane, diphenyldiethoxysilane, 3-chloropropylmethyldimethoxysilane, vinyltris(methylethylketoxim) silane, methyltris(methylethylketoxim)silane, vinyltriacetoxysilane.

Examples of the titanate compounds include tetraethyl orthotitanate, bis(dioctylpyrophosphato)ethylene titanate, isopropyl triactanoyl titanate, isopropyl dimethacryloyl isostearoyl titanate, isopropyl, isostearoyl diacryloyl titanate, isopropyl(dioctylphosphato) titanate, isopropyl tricumylphenyl titanate, isopropyl tri(N-aminoethylaminoethyl)titanate, dicumyl phenoxyaetate titanate, diisostearoylethylene titanate, isopropyl triinstearoyl titanate, isopropyl tridodecylbenzenesulfonyl titanate, isopropyltris(dioxtylphosphato) titanate, tetraisopropyl bis(dioctylphosphito) titanate, tetraoctyl bis(ditolidisylphosphito) titanate, tetra(2,2-diallyloxymethyl-1-butyl) bis(ditridexylphosphito) titanate, bis(dioxtylpyrophosphato)oxyacetate titanate, bis(dioctylpyrophosphato)oxyacetate titanate.

Examples of the aldehyde compounds include formaldehyde, acetaldehyde, propylaldehyde, butylaldehyde, glyoxal, gluralaldehyde, terephthalaldehyde.

Examples of the polyvalent metal salts include water soluble salts of zinc, calcium, magnesium, barium, strontium, cobalt, manganese, nickel.

Two or more cross-linking agents can be used in combination. The cross-linking agent preferably is soluble in water. If the cross-linking agent is not soluble in water, a dispersing agent is preferably used to disperse the cross-linking agent in water.

A combination of a resin with a cross-linking agent preferably is a water soluble carboxylic resin with a polyvalent metal salt, a water soluble carboxylic resin with a water-soluble epoxy resin, and a hydroxyl resin with dialdehyde.

The amount of the cross-linking agent is preferably in the range of 0.5 to 10 wt. % of the water-soluble resin. The amount is adjusted to improve water-resistance of the layer while the overcoating layer can be removed on a press machine.

An aqueous coating solution of the overcoating layer can contain a nonionic surface active agent to uniformly coat the layer. Examples of the nonionic surface active agents include sorbitan tristearate, sorbitan monoparmitate, sorbitan trioleate, monoglyceride stearate, polyoxyethylene nonylphenyl ether, polyoxyethylene dodecyl ether.

The overcoating layer contains the nonionic surface active agent preferably in an amount of 0.05 to 5 wt. % based on the total solid content of the overcoating layer.

The dry coating amount of the overcoating layer is preferably in the range of 0.1 to 4.0 $g/m^2$, and more preferably in the range of 0.10 to 0.25 $g/m^2$. The coating amount is adjusted to protect the hydrophilic layer while the overcoating layer can be removed on a press machine.

[Optional Components of Image-Forming Layer]

The image-forming layer can contain inorganic particles. The inorganic materials of the particles include silica, alumina, magnesium oxide, titanium dioxide, magnesium carbonate and a mixture thereof.

The inorganic particles have an average particle size preferably in the range of 5 nm to 10 μm, and more preferably in the range of 10 nm to 1 μm.

The inorganic particles are contained in the image-forming layer preferably in an amount of 1.0 to 70 wt. %, and more preferably in an amount of 5.0 to 50 wt. % based on the total solid contents of the image-forming layer.

The image-forming layer can contain organic particles (such as calcium alginate particles) in place of the above-mentioned inorganic particles.

The image-forming layer can contain a surface active agent. The surface active agents include a nonionic surface active agent (described in Japanese Patent Provisional Publication Nos. 62(1987)-251740, 3(1991)-208514), an anionic surface active agent, a cationic surface active agent (described in Japanese Patent Provisional Publication No. 2(1990)-195356), an amphoteric surface active agent (described in Japanese Patent Provisional Publication Nos. 59(1984)-121044, 4(1992)-13149) and a fluorine surface active agent.

[Formation of Image-Forming Layer]

The image-forming layer can be formed by dissolving, dispersing or emulsifying the contents of the layer in an solvent to prepare a coating solution and coating the prepared solution.

Examples of the solvents include halogenated hydrocarbons (e.g., ethylene chloride), ketones (e.g., cyclohexanone, methyl ethyl ketones), alcohols (e.g., methanol, ethanol, propanol, 1-methoxy-2-propanol), ethers (e.g., dimethoxyethane, ethylene glycol monomethyl ether), esters (e.g., 2-methoxyetyl acetate, 1-methoxy-2-propyl acetate, methyl lactate, ethyl lactate), amides.(e.g., N,N-dimethylacetamide, dimethylformamide), tetramethylurea, N-methylpyrrolidone, dimethyl sulfoxide, sulfolane, γ-butyrolactone, toluene and water.

The solid content in the coating solution is preferably in the range of 1 to 50 wt. %.

The image-forming layer can be formed by coating two or more coating solutions, which can be different from each other.

After drying the image-forming layer, the coated amount (solid content) of the image-forming layer is preferably in the range of 0.5 to 5.0 $g/m^2$. The coating amount is adjusted to control the sensitivity and the characteristics of the formed layer.

The image-forming layer can be coated according to a bar coating method, a rotating coating method, a spray coating method, a curtain coating method, a dip coating method, an air-knife coating method, a blade coating method or a roll coating method.

[Support]

The support preferably is a dimensionally stable film, plate or sheet.

In the first and second embodiments, a hydrophilic support is used to form a hydrophilic area.

Examples of the supports include paper, a paper laminated with a polymer (e.g., polyethylene, polypropylene, polystyrene) film, a metal (e.g., aluminum, zinc, copper) plate, a polymer (e.g., cellulose diacetate, cellulose triacetate, cellulose propionate, cellulose butyrate, cellulose acetate propionate, cellulose acetate butyrate, cellulose nitrate, polyethylene terephthalate, polyethylene, polystyrene, polypropylene, polycarbonate, polyvinyl acetal) film, a paper laminated with a metal, a polymer film laminated with a metal, a paper subjected to vapor deposition of a metal, a polymer film subjected to vapor deposition of a metal. A polymer film and a metal plate are preferred, and a polyester film and an aluminum plate are more preferred, and an aluminum plate is most preferred.

The aluminum plate subjected to anodic oxidation is particularly preferred.

The aluminum plate is a plate of pure aluminum or an alloy plate comprising the main component of aluminum and a little amount of other metals. Examples of the other metals include Si, Fe, Mn, Co, Mg, Cr, Zn, Bi, Ni and Ti. The amount of those metals is preferably of not more than 10 wt. %. It is technically difficult to prepare a pure aluminum in smelting. Therefore, an aluminum alloy plate comprising a little amount of other metals has been used in practice.

The aluminum plate has a thickness preferably of 0.1 to 0.6 mm, more preferably of 0.15 to 0.4 mm, and most preferably of 0.2 to 0.3 mm.

The surface of the aluminum plate is preferably subjected to a surface treatment such as a roughing treatment and an anodic oxidation treatment. The surface treatment has a function of making the surface more hydrophilic. The surface treatment has another function of improving adhesion between the support and the image-forming layer.

The aluminum plate can be subjected to a defatting treatment before conducting the surface treatment. The defatting treatment is conducted by using a surface active agent, an organic solvent or an aqueous alkaline solution to remove machine oil from the surface.

The roughing treatments include a mechanical roughing treatment, an electrochemical roughing treatment (dissolving the surface electrochemically to form a rough surface)

and a chemical roughing treatment (dissolving the surface chemically to form a rough surface).

Examples of the mechanical roughing treatment include a ball grinding method, a brush grinding method, a blast grinding method and a buff grinding method.

The electrochemical roughing treatment is, for example, a procedure in which direct or alternative current is applied to the plate in an electrolysis solution containing acid such as hydrochloric acid or nitric acid. The electrochemical roughing treatment can use a mixed acid, as is described in Japanese Patent Provisional Publication No. 54(1979)-63902.

After the roughing treatment, the aluminum plate can be subjected to alkali etching treatment. The alkali etching liquid preferably is an aqueous solution of potassium hydroxide or sodium hydroxide. After the alkali etching treatment, a neutralizing treatment can be conducted. An anodic oxidation treatment is preferably conducted to improve the abrasion resistance of the support after the neutralizing treatment.

An electrolyte is used in the anodic oxidation treatment to form a porous oxide film. Examples of the electrolytes include sulfuric acid, hydrochloric acid, oxalic acid, chromic acid, and a mixture thereof.

The anodic oxidation treatment is generally carried out under the specific conditions. For example, the concentration of the electrolytic solution is in the range of 1 to 80 wt. %, the temperature of the solution is in the range of 5 to 70° C., the electric current density is in the range of 5 to 60 $A/dm^2$, the voltage is in the range of 1 to 100 V, and the time for electrolysis is in the range of 10 seconds to 5 minutes.

The oxide film formed by the anodic oxidation has a thickness preferably of 1.0 to 5.0 $g/m^2$, and more preferably of 1.5 to 4.0 $g/m^2$.

The support can be further subjected to a surface treatment (e.g., a silicate treatment). The image forming layer can be formed on the treated surface. An undercoating layer can be formed on the support in place of the The hydrophilic treatment preferably is an alkali metal silicate treatment (described in U.S. patent Publication Nos. 2,714,066, 3,181,461, 3,280,734 and 3,902,734). In the alkali metal silicate treatment, the aluminum plate is immersed or subjected to electrolysis in an aqueous solution of alkali metal silicate (e.g., sodium silicate). The hydrophilic treatment can be also conducted by using a potassium fluorozirconate (described in Japanese Patent Publication No. 36(1961)-22063) and polyvinyl phosphonate (described in U.S. Pat. Nos. 3,276,868, 4,153,461, 4,689,272).

[Backing Layer]

A backing layer can be formed on a back side of the support. The backing layer is preferably formed by coating after subjecting the support to a surface treatment or forming an undercoating layer.

The backing layer preferably is a coating layer containing an organic polymer (described in Japanese Patent Provisional Publication No. 5(1993)-45885). The backing layer can be a coating layer comprising a metal oxide, which can be formed by hydrolysis or condensation polymerization of an organic or inorganic metallic compound (described in Japanese Patent Provisional Publication No. 6(1994)-35174). The organic metallic compound preferably is an alkoxy silicon compound such as $Si(OCH_3)_4$, $Si(OC_2H_5)_4$, $Si(OC_3H_7)_4$, $Si(OC_4H_9)_4$.

[Undercoating Layer]

An undercoating layer can be formed between the support and the image-forming layer or the backing layer.

The undercoating layer can function as a thermal barrier layer. The thermal barrier layer can prevent heat (formed by converting infrared light) diffusing from the image-forming layer to the support. Therefore, the thermal barrier layer has a function of improving the thermal efficiency of the presensitized lithographic plate. In other words, the sensitivity of the presensitized lithographic plate can be improved by the thermal barrier layer as the undercoating layer.

The undercoating layer can have another function of improving on press development in which the image-forming layer within the unexposed area is removed from the support.

The undercoating layer can be formed by using a silane coupling agent or a phosphoric compound having an ethylenically unsaturated double bond that can be reacted to cause an addition polymerization (described in Japanese Patent Provisional Publication No. 10(1998)-282679).

The coating amount (solid contents) of the undercoating layer is preferably in the range of 0.1 to 100 $mg/m^2$, and more preferably in the range of 3 to 30 $mg/m^2$.

[Overcoating Layer Provided on Image-Forming Layer]

An overcoating layer can be formed on the image-forming layer. The overcoating layer can have a function of protecting the surface of the image-forming layer from scratch. The overcoating layer can have another function of preventing oxygen from permeating the image-forming layer. The overcoating layer can further has a function of protecting the image-forming layer from abrasion when the presensitized lithographic plate is scanned with a laser bean of high illuminance.

The presensitized lithographic plate is exposed to infrared light usually in the air, which contains oxygen, which has a function of inhibiting a polymerization reaction. The overcoating layer preferably has a function of preventing oxygen or a low molecular weight basic substance from permeating the image-forming layer. The overcoating layer preferably has a low permeability to a substance of a low molecular weight. The overcoating layer further preferably is transparent to infrared light. The overcoating layer furthermore has a good adhesion to the image-forming layer. Moreover, the overcoating layer preferably is easily removed at on press development. The overcoating layer is described in U.S. Pat. No. 3,458,311 and Japanese Patent Provisional Publication No. 55(1980)-49729.

The overcoating layer preferably comprises a water-soluble polymer that can be crystallized. Examples of the water-soluble polymers include polyvinyl alcohol, polyvinyl pyrrolidone, acidic cellulose derivatives, gelatin, gum arabic and polyacrylic acid. Polyvinyl alcohol (PVA) is particularly preferred. Polyvinyl alcohol has an excellent function of preventing oxygen from permeating the image-forming layer. Polyvinyl alcohol can be easily removed at on press development. The functions are given by non-substituted vinyl alcohol units contained in the polyvinyl alcohol. Alcoholic hydroxyl groups in polyvinyl alcohol can be substituted with an ester bond, an ether bond or an acetal bond so long as a considerable amount of the alcoholic hydroxyl remain in polyvinyl alcohol. Polyvinyl alcohol can be a copolymer of vinyl alcohol units with the other repeating units.

Polyvinyl alcohol has a saponification degree preferably in the range of 71 to 100%. Polyvinyl alcohol has a polymerization degree preferably in the range of 300 to 2,400. The overcoating layer can be formed by using a commercially available polyvinyl alcohol (e.g., PVA-105, PVA-105, PVA-110, PVA-117, PVA-117H, PVA-120, PVA- 124, PVA-124H, PVA-CS, PVA-CST, PVA-HC, PVA-203, PVA-204, PVA-205, PVA-210, PVA-217, PVA-220, PVA-224, PVA-217EE, PVA-217E, PVA-220E, PVA-224E, PVA-405, PVA-420, PVA-613, L-8, Kuraray Co., Ltd.).

Polyvinyl alcohol having a high saponification degree (in which the ratio of the non-substituted vinyl alcohol units is high) or a thick overcoating layer has an excellent function of preventing oxygen from permeating the image-forming layer to improve the sensitivity. However, an extremely low permeability to oxygen is not necessary. Permeability to oxygen at 25° C. under ordinary atmosphere (cc/$m^2$ day) is preferably in the range of 0.2 to 20.

The overcoating layer can contain a polyhydric alcohol (e.g., glycerin, dipropylene glycol) to improve flexibility. The overcoating layer contains the polyhydric alcohol preferably in an amount of 1 to 10 wt. % based on the amount of the water-soluble polymer.

The overcoating layer can contain an anionic surface active agent (e.g., sodium alkylsulfate, sodium alkylsulfonate), an amphoteric surface active agent (e.g., a salt of alkyl aminocarboxylate, a salt of alkylaminodicarboxylate) or a nonionic surface active agent (e.g., polyoxyethylene alkylphenyl ether). The overcoating layer contain the surface active agent preferably in an amount of 1 to 10 wt. % based on the amount of the water-soluble polymer.

The overcoating layer has a thickness preferably in the range of 0.1 to 5 μm, and more preferably in the range of 0.2 to 2 μm.

The overcoating layer comprising a water-soluble polymer, which is a hydrophilic layer tends to be peeled from the image-forming layer. If the overcoating layer is peeled from the image-forming layer, the image-forming layer is not protected from oxygen. The overcoating layer can further contain an acrylic emulsion or a water insoluble polymer (such as vinyl pyrrolidone-vinyl acetate copolymer) in an amount of 20 to 60 wt. % based on the water-soluble polymer to improve the adhesion between the overcoating layer and the image-forming layer, as is described in Japanese Patent Provisional Publication No. 49(1974)-70702 and British Patent Publication No. 1,303,578. A method of coating a overcoating layer is described in U.S. Pat. No. 3,458,311 and Japanese Patent Provisional Publication No. 55(1980)-49729.

The overcoating layer can function as a color filter layer. For example, the overcoating layer can contain a coloring agent (preferably a water-soluble dye) that is transparent to infrared light (which is used in image formation) and absorbs the other light. The coloring agent has a function of decreasing sensitivity to safe light without decreasing sensitivity to infrared light.

[Step of Imagewise Exposure]

The presensitized lithographic plate is imagewise exposed to infrared light. The presensitized lithographic plate is preferably scanned with infrared laser beam.

The infrared light has a wavelength preferably in the range of 700 to 1,200 nm.

The light source of the infrared laser bean preferably is a solid laser or a semi-conductor laser. Power of the infrared laser is preferably not less than 100 mW. A multi-beam laser device can be used to shorten the exposure time.

The exposure time for one pixel is preferably shorter than 20 micro seconds. The exposure energy is preferably in the range of 10 to 300 mJ/$cm^2$.

The presensitized lithographic plate mounted on a cylinder of a printing press can be imagewise exposed to infrared light (as is described in Japanese Patent No. 2,938,398).

In the case that the infrared absorbing agent functions as an agent of converting light to heat, convert heat energy is transferred to the polymerization initiator, which functions as a thermal polymerization initiator. In the case that the infrared absorbing agent functions as an infrared sensitizing dye, light energy is converted to a chemical energy, which is transferred to the polymerization initiator, which functions as a photo- polymerization initiator. The infrared absorbing agent can have two or more functions described above.

A presensitized lithographic plate of the first embodiment is imagewise exposed to infrared light to make the removable image-forming layer to be irremovable within the exposed area.

A presensitized lithographic plate of the second embodiment is imagewise exposed to infrared light to make the irremovable image-forming layer to be removable within the exposed area.

A presensitized lithographic plate of the third embodiment is imagewise exposed to infrared light to make the hydrophilic image-forming layer to be hydrophobic within the exposed area.

A presensitized lithographic plate of the fourth embodiment is imagewise exposed to infrared light to make the hydrophobic image-forming layer to be hydrophilic within the exposed area; and then A presensitized lithographic plate of the fifth embodiment is imagewise exposed to infrared light to abrade the hydrophilic layer within the exposed area.

In the third to fifth embodiment, a lithographic plate can be prepared by conducting only the step of imagewise exposure.

[Step of on Press Development]

In the first and second embodiment, the image-forming layer is removed within the unexposed area of the lithographic plate mounted on a cylinder of a printing press after exposing the presensitized lithographic plate.

At the step of on press development, dampening water and oily ink are supplied to the lithographic plate.

The image-forming layer within the unexposed area can be removed by a chemical function, a mechanical force or a combination thereof. The chemical function is given by water (in dampening water) or oil (in oily ink). Namely, the image-forming layer is dissolved or dispersed in water or oil. The mechanical force is given by cylinders of the printing press.

After the image-forming layer is removed within the unexposed area, a hydrophilic surface of the support is exposed, which forms a hydrophilic (non-image) area. On the other hand, the image-forming layer remains on the hydrophilic support within the exposed area, which corresponds to a hydrophobic (image) area.

[Step of Printing]

After the imagewise exposure (third, fourth and fifth embodiment) or on press development (first and second embodiment), an image can be printed with the lithographic plate mounted on the cylinder of the printing press. Accordingly, the step of on press development and the step of printing can be continuously conducted.

In the printing step, dampening water and oily ink is supplied to the lithographic plate. The dampening water is attached to the hydrophilic non-image area, and the oily ink is attached to the hydrophobic image area. The oily ink is preferably first supplied to the lithographic plate to prevent contamination of dampening water from contents of the image-forming layer within the non-image area.

As is described above, the lithographic plate is developed, and printing process is conducted to the lithographic plate mounted on the cylinder of the printing press.

EXAMPLE 1

(Preparation of Aluminum Support)

Melt of JIS-A-1050 alloy containing Al (99.5 wt. % or more), Fe (0.30 wt. %), Si (0.10 wt. %), Ti (0.02 wt. %), Cu (0.013 wt. %) and inevitable impurities (the rest) was cleaned and molded. For cleaning the melt, the melt was degassed to remove contaminating gases (such as hydrogen gas), and then filtrated through a ceramic tube filter. For molding the melt, the DC molding was carried out. The solidified molded metal was in the form of a plate having 500 mm thickness. The plate was planed off by 10 mm, and then subjected to uniforming treatment at 550° C. for 10 hours so that the intermetallic compounds might not agglomerate. After hot rolling at 400° C., the plate was annealed at 500° C. for 60 seconds in an annealing furnace. The plate was then subjected to cold rolling to obtain an aluminum plate having 0.30 mm thickness. The surface of the rolling mill was beforehand controlled to have such roughness that the aluminum plate might have a central surface roughness (Ra) of 0.2 μm. The aluminum plate was then installed in a tension leveler to improve the planeness.

The obtained plate was subjected to the following surface treatments, to form a support of lithographic printing plate.

The rolling oil was removed form the surface of the plate, The plate was subjected to oil-removing treatment with a 10 wt. % aqueous solution of sodium aluminate at 50° C. for 30 seconds. The plate was then neutralized with a 30 wt. % aqueous solution of sulfuric acid at 50° C. for 30 seconds, and the smut was removed.

Next, the plate surface was subjected to roughing treatment (what is called sand roughing) to improve adhesion between the support and the image-forming layer and to make the non-imaging area keep enough water. In an aqueous solution containing nitric acid (1 wt. %) and aluminum nitrate (0.5 wt. %) at 45° C., the plate was subjected to electrolytic sand roughing treatment. In the treatment, while an aluminum web was left in the solution, an indirect power cell supplied an alternative current of alternative wave under the conditions of the electric current density of 20 $A/dm^2$, the duty ratio of 1:1 and the anodic electricity of 240 $C/dm^2$. After the treatment, the plate was subjected to etching treatment with a 10 wt. % aqueous solution of sodium aluminate at 50° C. for 30 seconds. The plate was then neutralized with a 30 wt. % aqueous solution of sulfuric acid at 50° C. for 30 seconds, and the smut was removed.

Further, for improving the abrasion resistance, the chemical resistance and the water retainment, an oxide film was formed on the support by anodic oxidation. In the film formation, while an aluminum web was left in a 20% aqueous solution of sulfuric acid at 35° C., an indirect power cell supplied a direct current of 14 $A/dm^2$ to electrolyze for forming an oxide film of 2.5 $g/m^2$.

The plate was subjected to silicate treatment to make the non-imaging area more hydrophilic. In the treatment, the plate was made contact with an aluminum web for 15 seconds in a 1.5 wt. % aqueous solution of sodium silicate (No. 3) at 70° C., and washed with water. The amount of attached Si was 10 $mg/m^2$. The thus-prepared support had a central surface roughness (Ra) of 0.25 μm.

(Preparation of Particle Dispersion)

In 18 g of ethyl acetate, 5 g of polystyrene (weight average molecular weight: 45,000), 1.5 g of the following infrared absorbing agent (1), 0.2 g of an anionic surface active agent (Pionine A-41C, Takemoto oil & fat Co., Ltd.), and 1.5 g of the following dye precursor (1) were dissolved.

Infrared absorbing agent (1)

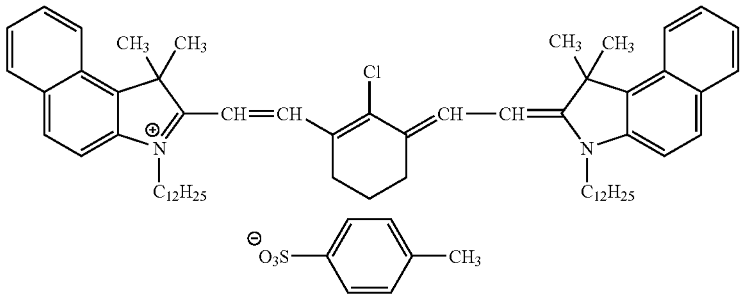

-continued

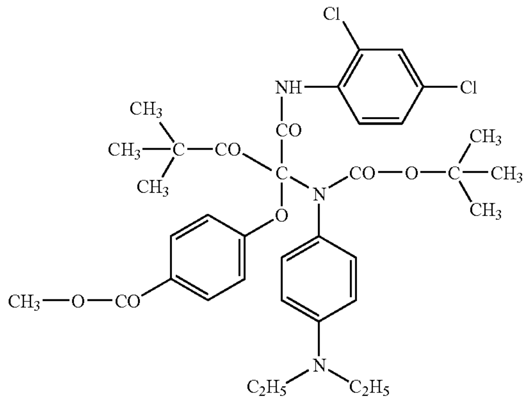

Dye precursor (1)

The solution was added to 36 g of 4 wt. % aqueous solution of polyvinyl alcohol (PVA-205, Kuraray Co., Ltd.). The mixture was stirred by a homogenizer at 12,000 rpm for 10 minutes to obtain an emulsion. To the emulsion, 24 g of water was added. The mixture was stirred at 60° C. for 90 minutes to evaporate methyl acetate. Thus, particle dispersion was prepared. The concentration (solid content) of the dispersion was 15 wt. %, and the average particle size was 0.30 μm.

(Formation of Image-Forming Layer)

In 100 g of water, the prepared particle dispersion (containing 5 g of particles in terms of the solid content) and 0.5 g of polyvinyl alcohol were mixed to prepare a coating solution.

20 sheets of paper were used until the press development was completed. The plate wear was 10,000 sheets.

EXAMPLE 2

(Preparation of Microcapsule Dispersion)

In 40 g of ethyl acetate, 18 g of an adduct of trimethylolpropane with xylene diisocyanate (Takenate D-110N, Mistui-Takeda Chemicals, Inc.), 10 g of the following vinyl ether compound, 5 g of the infrared absorbing agent (1) used in Example 1, 4 g of the dye precursor (1) used in Example 1, and 0.2 g of an anionic surface-active agent (Pionine A-41C, Takemoto oil & fat Co., Ltd.) were dissolved to prepare an oil phase.

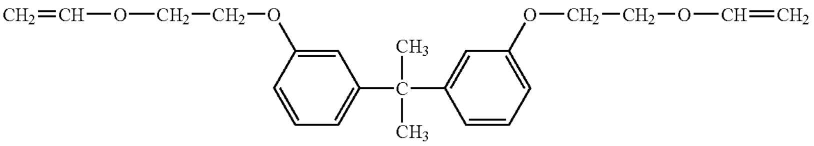

Vinyl ether compound

The coating solution was coated on the aluminum support, and dried in an oven at 70° C. for 90 seconds to form an image-forming layer in the dry coating amount of 0.8 g/$m^2$. Thus, a presensitized lithographic plate according to the first embodiment was produced.

(Process and Evaluation)

The above-produced presensitized lithographic plate was imagewise exposed by means of an image exposing machine (Trendsetter 3244VX, from Creo) equipped with a water-cooling semiconductor infrared laser of 40 W. The exposing conditions were so adjusted that the plate surface energy was 300 mJ/$cm^2$, and the resolution was 2,400 dpi.

The exposed area was colored, and a contrast between the exposed are and the unexposed area was remarkable. Therefore, the printing out image was confirmed with naked eyes.

Without subjecting to the developing treatment, the exposed plate was immediately installed on the cylinder of printer (Heidelberg SOR-M). Dampening water was supplied, an ink was further supplied, and then paper was supplied to the printer.

Independently, 80 g of 4 wt. % aqueous solution of polyvinyl alcohol (PVA-205, Kuraray Co., Ltd.) was prepared as an aqueous phase.

The oil and aqueous phases were mixed and emulsified with a homogenizer at 12,000 rpm for 10 minutes. To the obtained emulsion, 70 g of water was added. The mixture was stirred at room temperature for 30 minutes, and further stirred at 40° C. for 3 hours to prepare microcapsule dispersion. The microcapsule dispersion was diluted with distilled water to adjust the solid content of 18 wt. %. The average particle size of the microcapsules was 0.35 μm.

(Formation of Image-Forming Layer)

In 100 g of water, the prepared microcapsule dispersion (containing 5 g of microcapsules in terms of the solid content), 0.5 g of polyvinyl alcohol and 0.5 g of the following acid precursor were mixed to prepare a coating solution.

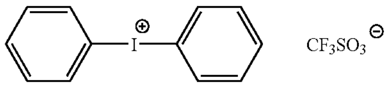

Acid precursor

The coating solution was coated on the aluminum support prepared in Example 1, and dried in an oven at 80° C. for 90 seconds to form an image-forming layer in the dry coating amount of 1.0 g/$m^2$. Thus, a presensitized lithographic plate according to the first embodiment was produced. ( Process and Evaluation)

The above-produced presensitized lithographic plate was imagewise exposed by means of an image exposing machine (Trendsetter 3244VX, from Creo) equipped with a water-cooling semiconductor infrared laser of 40 W. The exposing conditions were so adjusted that the plate surface energy was 300 mJ/$cm^2$, and the resolution was 2,400 dpi.

The exposed area was colored, and a contrast between the exposed are and the unexposed area was remarkable. Therefore, the printing out image was confirmed with naked eyes.

Without subjecting to the developing treatment, the exposed plate was immediately installed on the cylinder of printer (Heidelberg SOR-M). Dampening water was supplied, an ink was further supplied, and then paper was supplied to the printer.

20 sheets of paper were used until the press development was completed. The plate wear was 10,000 sheets.

EXAMPLE 3

(Formation of Image-Forming Layer)

The following coating solution was coated on the aluminum support prepared in Example 1, and dried at 80° C. for 90 seconds in an oven to form an image-forming layer in the dry coating amount of 1.0 g/$m^2$. Thus, a presensitized lithographic plate according to the first embodiment was produced.

| Coating solution for image-forming layer | |
|---|---|
| The following infrared absorbing agent (2) | 0.05 g |
| The following dye precursor (2) | 0.05 g |
| The following polymerization initiator | 0.2 g |
| The following binder polymer (average molecular weight: 80,000) | 0.75 g |
| Triacrylate denatured with ethylene oxide isocyanurate (NK Ester M-315, Shin Nakamura Chemical Industries) | 0.75 g |
| The following fluorine containing surface active agent | 0.1 g |
| Methyl ethyl ketone | 8.0 g |
| Tetrahydrofuran | 10 g |

Infrared absorbing agent (2)

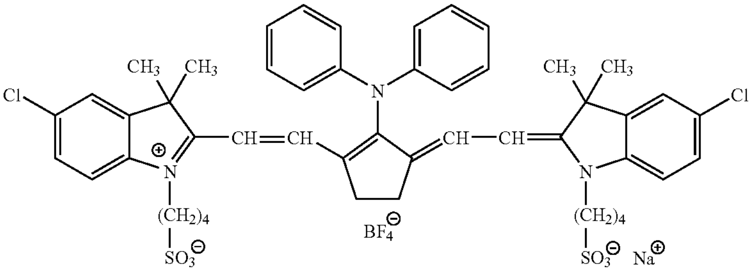

Dye precursor (2)

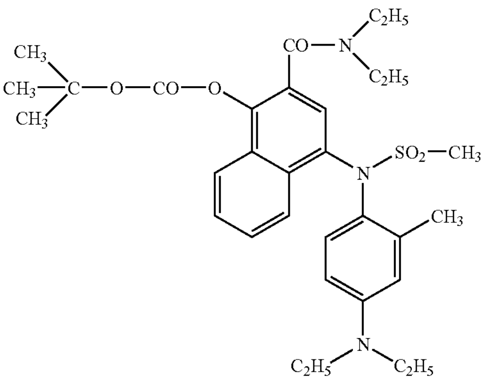

Polymerization initiator

-continued

| Coating solution for image-forming layer |
|---|
| 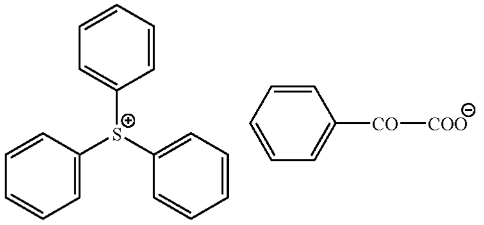 |
| Binder polymer |
| 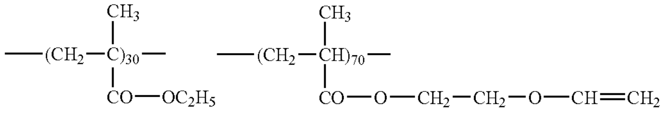 |
| Fluorine containing surface active agent |
| 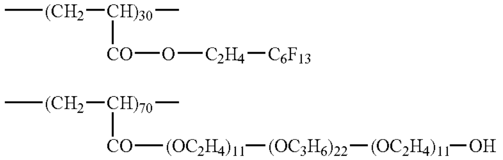 |

(Process and Evaluation)

The above-produced presensitized lithographic plate was imagewise exposed by means of an image exposing machine (Trendsetter 3244VX, from Creo) equipped with a water-cooling semiconductor infrared laser of 40 W. The exposing conditions were so adjusted that the plate surface energy was 300 $mJ/cm^2$, and the resolution was 2,400 dpi.

The exposed area was colored, and a contrast between the exposed are and the unexposed area was remarkable. Therefore, the printing out image was confirmed with naked eyes.

Without subjecting to the developing treatment, the exposed plate was immediately installed on the cylinder of printer (Heidelberg SOR-M). Dampening water was supplied, an ink was further supplied, and then paper was supplied to the printer.

20 sheets of paper were used until the press development was completed. The plate wear was 10,000 sheets.

EXAMPLE 4

(Preparation of Aluminum Support)

The procedure of Example 1 was repeated except that the silicate treatment was not conducted.

The thus-prepared support had a central surface roughness (Ra) of 0.25 μm.

(Preparation Sol Composition)

The following components were well mixed, and stirred at room temperature for 2 hours to cause hydrolysis to prepare a sol composition.

| Sol composition | |
|---|---|
| Polyacrylamide having 3-(trimethoxysilyl)propylthio as a terminal group | 21 g |
| Tetramethoxysilane | 62 g |

-continued

| Sol composition | |
|---|---|
| Methanol | 470 g |
| 1 N aqueous solution of nitric acid | 10 g |

(Formation of Image-Forming Layer)

The following coating solution was coated on the aluminum support, and dried at 70° C. for 10 minutes to form an image-forming layer in the dry coating amount of 3.0 $g/m^2$. Thus, a presensitized lithographic plate according to the third embodiment was produced. The surface contact angle to water (water drop in air) measured by using a machine (Contact Angle Meterca Z, Kyowa Surface Science) was 6.5°, which means a strongly hydrophilic surface.

| Coating solution for image-forming layer | |
|---|---|
| Sol composition | 66 g |
| The particle dispersion prepared in Example 1 | 400 g |
| Water | 374 g |

(Process and Evaluation)

The above-produced presensitized lithographic plate was imagewise exposed by means of an image exposing machine (Trendsetter 3244VX, from Creo) equipped with a water-cooling semiconductor infrared laser of 40 W. The exposing conditions were so adjusted that the plate surface energy was 300 $mJ/cm^2$, and the resolution was 2,400 dpi.

The exposed area was colored, and a contrast between the exposed are and the unexposed area was remarkable. Therefore, the printing out image was confirmed with naked eyes.

Without subjecting to the developing treatment, the exposed plate was immediately installed on the cylinder of printer (Heidelberg SOR-M). Dampening water was supplied, an ink was further supplied, and then paper was supplied to the printer.

The plate wear was 10,000 sheets.

EXAMPLE 5

(Formation of Image-Forming Layer)

The following coating solution was coated on the aluminum support prepared in Example 1, and dried at 70° C. for 3 minutes to form an image-forming layer in the dry coating amount of 1.0 $g/m^2$. Thus, a presensitized lithographic plate according to the second embodiment was produced.

(Process and Evaluation)

The above-produced presensitized lithographic plate was imagewise exposed by means of an image exposing machine (Trendsetter 3244VX, from Creo) equipped with a water-cooling semiconductor infrared laser of 40 W. The exposing conditions were so adjusted that the plate surface energy was 300 $mJ/cm^2$, and the resolution was 2,400 dpi.

The exposed area was colored, and a contrast between the exposed are and the unexposed area was remarkable. Therefore, the printing out image was confirmed with naked eyes.

Without subjecting to the developing treatment, the exposed plate was immediately installed on the cylinder of

| Coating solution for image-forming layer | |
|---|---|
| The hydrophobic polymer convertible to hydrophilic comprising the following repeating units | 0.450 g |
| The following infrared absorbing agent (3) | 0.025 g |
| The following dye precursor (3) | 0.025 g |
| Methyl ethyl ketone | 3.000 g |
| Tetrahydrofuran | 3.000 g |

Hydrophobic polymer convertible to hydrophilic (repeating unit)

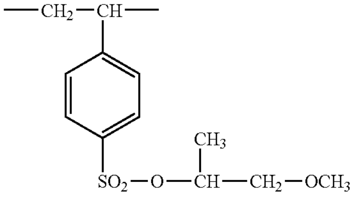

Infrared absorbing agent (3)

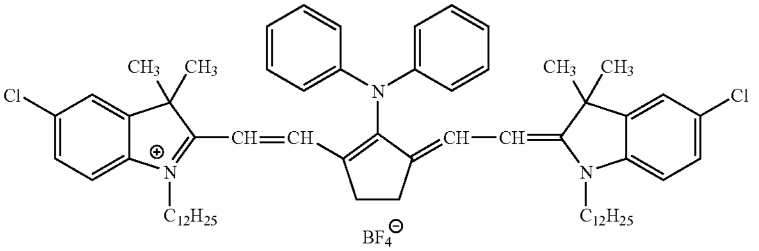

Dye precursor (3)

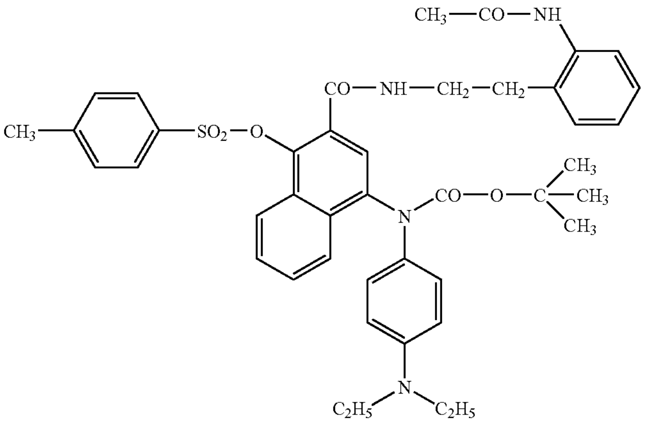

printer (Heidelberg SOR-M). Dampening water was supplied, an ink was further supplied, and then paper was supplied to the printer.

The plate wear was 10,000 sheets.

EXAMPLE 6

(Formation of Ink-Receiving Layer)

The following coating solution was coated on the aluminum support prepared in Example 4, and dried at 70° C. for 3 minutes to form an ink-receiving layer in the dry coating amount of 0.42 g/m$^2$.

| Coating solution for ink-receiving layer | |
|---|---|
| Epicoat 1009 (epoxy resin, Japan Epoxy Resin Co., Ltd.) | 1.2 g |
| Epicoat 1001 (epoxy resin, Japan Epoxy Resin Co., Ltd.) | 0.3 g |
| Infrared absorbing agent (1) used in Example 1 | 0.3 g |
| Dye precursor (1) used in Example 1 | 0.1 g |
| Methyl ethyl ketone | 13.5 g |
| Propylene glycol monomethyl ether | 13.5 g |
| Tetrahydrofuran | 13.5 g |

(Formation of Hydrophilic Layer)

The following coating solution was coated on the ink-receiving layer, and dried at 80° C. for 1 minute to form a hydrophilic layer in the dry coating amount of 0.40 g/m$^2$.

| Coating solution for hydrophilic layer | |
|---|---|
| Methanol silica sol containing colloidal silica particles of 10 to 20 nm in amount of 30 wt. % (Nissan Chemical Industries) | 3.0 g |
| Polyacrylic acid (weight average molecular weight: 250,000, Wako Junyaku Co., Ltd.) | 0.1 g |

(Formation of Overcoating Layer)

The following coating solution was coated on the hydrophilic layer, and dried at 90° C. for 1.5 minute to form an overcoating layer in the dry coating amount of 0.15 g/m$^2$. Thus, a presensitized lithographic plate according to the fifth embodiment was produced.

| Coating solution for overcoating layer | |
|---|---|
| 28 Wt. % aqueous solution of gum arabic | 1.5 g |
| Infrared absorbing agent (7) | 0.042 g |
| Emulex #710 (10 wt. % aqueous solution, Japan Emulsion Co. Ltd.) | 0.168 g |
| Magnesium acetate tetrahydrate (10 wt. % aqueous solution, Wako Junyaku Co., Ltd.) | 0.03 g |
| Distilled water | 30.06 g |

(Process and Evaluation)

The above-produced presensitized lithographic plate was imagewise exposed by means of an image exposing machine (Trendsetter 3244VX, from Creo) equipped with a water-cooling semiconductor infrared laser of 40 W. The exposing conditions were so adjusted that the plate surface energy was 300 mJ/cm$^2$, and the resolution was 2,400 dpi.

The exposed area was colored, and a contrast between the exposed are and the unexposed area was remarkable. Therefore, the printing out image was confirmed with naked eyes.

Without subjecting to the developing treatment, the exposed plate was immediately installed on the cylinder of printer (Heidelberg SOR-M). Dampening water was supplied, an ink was further supplied, and then paper was supplied to the printer.

The plate wear was 5,000 sheets.

EXAMPLE 7

(Preparation of Microcapsule Dispersion)

In 17 g of ethyl acetate, 10 g of an adduct of trimethylolpropane with xylene diisocyanate (Takenate D-110N, Mistui-Takeda Chemicals, Inc.), 3.15 g of pentaerythritol triacrylate (SR444, Nippon Kayaku Co., Ltd.), 0.7 g of the infrared absorbing agent (3) used in Example 3, 4 g of the dye precursor (1) used in Example 1 and 0.1 g of an anionic surface-active agent (Pionine A-41C, Takemoto oil & fat Co., Ltd.) were dissolved to prepare an oil phase.

Independently, 40 g of 4 wt. % aqueous solution of polyvinyl alcohol (PVA-205, Kuraray Co., Ltd.) was prepared as an aqueous phase.

The oil and aqueous phases were mixed and emulsified with a homogenizer at 12,000 rpm for 10 minutes. To the obtained emulsion, 25 g of distilled water was added. The mixture was stirred at room temperature for 30 minutes, and further stirred at 40° C. for 3 hours to prepare microcapsule dispersion. The microcapsule dispersion was diluted with distilled water to adjust the solid content of 20 wt. %. The average particle size of the microcapsules was 0.30 μm.

(Formation of Image-Forming Layer)

In 100 g of water, the prepared microcapsule dispersion (containing 5 g of microcapsule in terms of the solid content), 0.5 g of the polymerization initiator used in Example 3 and 0.2 g of the fluorine containing surface active agent used in Example 3 were mixed to prepare a coating solution.

The coating solution was coated on the aluminum support prepared in Example 1 by using a bar coater, and dried in an oven at 70° C. for 60 seconds to form an image-forming layer. Thus, a presensitized lithographic plate according to the first embodiment was produced.

(Process and Evaluation)

The above-produced presensitized lithographic plate was imagewise exposed by means of an image exposing machine (Trendsetter 3244VX, from Creo) equipped with a water-cooling semiconductor infrared laser of 40 W. The exposing conditions were so adjusted that the plate surface energy was 300 mJ/cm$^2$, and the resolution was 2,400 dpi.

The exposed area was colored, and a contrast between the exposed are and the unexposed area was remarkable. Therefore, the printing out image was confirmed with naked eyes.

Without subjecting to the developing treatment, the exposed plate was immediately installed on the cylinder of printer (Heidelberg SOR-M). Dampening water was supplied, an ink was further supplied, and then paper was supplied to the printer.

20 sheets of paper were used until the press development was completed. The plate wear was 10,000 sheets.

EXAMPLE 8

(Formation of Image-Forming Layer)

In a reaction vessel, 4 g of tetraethoxysilane and 10 g of methyl ethyl ketone were placed. To the vessel, 1.4 g of 0.05 N hydrochloric acid was further added. The mixture was well stirred for 30 minutes to cause partial hydrolysis polymerization to obtain a uniform solution.

The following additional components were added to the uniform solution to prepare a coating solution. The coating solution was coated on the aluminum support prepared in Example 1, and dried at 70° C. for 2 minutes to form an image-forming layer in the dry coating amount of 1.0 g/$m^2$. Thus, a presensitized lithographic plate according to the fourth embodiment was produced. The surface contact angle to water (water drop in air) measured by using a machine (Contact Angle Meterca Z, Kyowa Surface Science) was 80°, which means a strongly hydrophobic surface.

| Additional components for image-forming layer | |
|---|---|
| The hydrophobic polymer convertible to hydrophilic comprising the following repeating units | 3 g |
| The dye precursor (3) used in Example 3 | 0.3 g |
| Infrared absorbing agent (1) used in Example 1 | 0.15 g |
| Methyl ethyl ketone | 9 g |
| γ-Butyrolactone | 6 g |

Hydrophobic polymer convertible to hydrophilic (repeating unit)

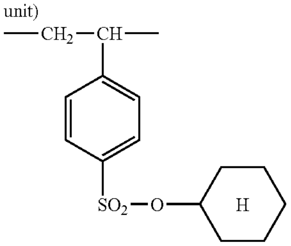

(Process and Evaluation)

The above-produced presensitized lithographic plate was imagewise exposed by means of an image exposing machine (Trendsetter 3244VX, from Creo) equipped with a water-cooling semiconductor infrared laser of 40 W. The exposing conditions were so adjusted that the plate surface energy was 300 mJ/$cm^2$, and the resolution was 2,400 dpi. The surface contact angle within the exposed area was changed to 50°, which means a strongly hydrophilic surface.

The exposed area was colored, and a contrast between the exposed are and the unexposed area was remarkable. Therefore, the printing out image was confirmed with naked eyes.

Without subjecting to the developing treatment, the exposed plate was immediately installed on the cylinder of printer (Heidelberg SOR-M). Dampening water was supplied, an ink was further supplied, and then paper was supplied to the printer.

The plate wear was 10,000 sheets.

The invention claimed is:

1. A lithographic printing process which comprises the steps of:

imagewise exposing to infrared light a presensitized lithographic plate which comprises a hydrophilic support and a removable image-forming layer containing an infrared absorbing agent having the absorption maximum within an infrared region and a dye precursor having a p-phenylenediamine structure and a releaseable group attached to nitrogen atom of the p-phenylenediamine structure, and having substantially no absorption within a visible region that decomposes on heating or light exposure to form a visible dye having an absorption within a visible region within the exposed area by releasing the releaseable group from p-phenylenediamine structure, and to make the image-forming layer irremovable within the exposed area;

removing the image-forming layer within the unexposed area of the lithographic plate mounted on a cylinder of a printing press; and then printing an image with the lithographic plate mounted on the cylinder of the printing press, wherein the dye precursor is represented by the formula (I), and the visible dye is represented by the formula (II):

$$R_2N—(p\text{-}Ph)—N(—Y)—L—Z \quad (I)$$

$$R_2N—(p\text{-}Ph)—N=L \quad (II)$$

in which each of the two groups represented by R independently is hydrogen or an alkyl group having 1 to 20 carbon atoms; p-Ph is p-phenylene, which can be substituted with an alkyl group having 1 to 20 carbon atoms; L is a divalent linking group; and each of Y and Z independently is a releasable group.

2. A lithographic printing process which comprises the steps of: imagewise exposing to infrared light a presensitized lithographic plate which comprises a hydrophilic support and an irremovable image-forming layer containing an infrared absorbing agent having the absorption maximum within an infrared region and a dye precursor having a p-phenylenediamine structure and a releaseable group attached to nitrogen atom of the p-phenylenediamine structure, and having substantially no absorption within a visible region that decomposes on heating or light exposure to form a visible dye having an absorption within a visible region within the exposed area by releasing the releasable group from p-phenylenediamine structure, and to make the image forming layer removable within the exposed area;

removing the image-forming layer within the exposed area of the lithographic plate mounted on a cylinder of a printing press; and then printing an image with the lithographic plate mounted on the cylinder of the printing press, wherein the dye precursor is represented by the formula (I), and the visible dye is represented by the formula (II)

$$R_2N—(p\text{-}Ph)—N(—Y)—L—Z \quad (I)$$

$$R_2N—(p\text{-}Ph)—N=L \quad (II)$$

in which each of the two groups represented by R independently is hydrogen or an alkyl group having 1 to 20 carbon atoms; p-Ph is p-phenylene, which can be substituted with an alkyl aroup having 1 to 20 carbon atoms; L is a divalent linking group; and each of Y and Z independently is a releasable group.

3. A lithographic printing process which comprises the steps of: imagewise exposing to infrared light a presensitized lithographic plate which comprises a support and a hydrophilie image-forming layer containing an infrared absorbing agent having the absorption maximum within an infrared region and a dye precursor having a p-phenylenediamine structure and a releaseable group attached to nitrogen atom of the p-phenylenediamine structure, and having substantially no absorption within a visible region that decomposes on heating or light exposure to form a visible dye having an absorption within a visible region within the exposed area by releasing the releaseable group from p-phenylenediamine structure, and to make the image-forming layer hydrophobic within the exposed area; and then printing an image with the lithographic plate mounted on a cylinder of a printing press, wherein the dye precursor is represented by the formula (I), and the visible dye is represented by the formula (II):

$$R_2N—(p\text{-}Ph)—N(—Y)—L—Z \quad (I)$$

$$R_2N—(p\text{-}Ph)—N{=}L \quad (II)$$

in which each of the two groups represented by R independently is hydrogen or an alkyl group having 1 to 20 carbon atoms; p-Ph is p-phenylene, which can be substituted with an alkyl group having 1 to 20 carbon atoms; L is a divalent linking group; and each of Y and Z independently is a releasable group.

4. A lithographic printing process which comprises the steps of imagewise exposing to infrared light a presensitized lithographic plate which comprises a support and a hydrophobic image-forming layer containing an infrared absorbing agent having the absorption maximum within an infrared region and a dye precursor having a p-phenylenediamine structure and a releaseable group attached to nitrogen atom of the p-phenylenediamine structure, and having substantially no absorption within a visible region that decomposes on heating or light exposure to form a visible dye having an absorption within a visible region within the exposed area by releasing the releaseable group from p-phenylenediamine structure, and to make the image-forming layer hydrophilic within the exposed area; and then printing an image with the lithographic plate mounted on a cylinder of a printing press, wherein the dye precursor is represented by the formula (I), and the visible dye is represented by the formula (II):

$$R_2N—(p\text{-}Ph)—N(—Y)—L—Z \quad (I)$$

$$R_2N—(p\text{-}Ph)—N{=}L \quad (II)$$

in which each of the two groups represented by R independently is hydrogen or an alkyl group having 1 to 20 carbon atoms; p-Ph is p-phenylene, which can be substituted with an alkyl group having 1 to 20 carbon atoms; L is a divalent linking group; and each of Y and Z independently is a releasable group.

5. A lithographic printing process which comprises the steps of: imagewise exposing to infrared light a presensitized lithographic plate which comprises a support, an ink receiving layer and a hydrophilic layer in order, said ink receiving layer containing a dye precursor having a p-phenylenediamine structure and a releaseable group attached to nitrogen atom of the p-phenylenediamine structure, and having substantially no absorption within a visible region, that decomposes on heating or light exposure, and said ink receiving layer or said hydrophilic layer containing an infrared absorbing agent having the absorption maximum within an infrared region to form a visible dye having an absorption within a visible region within the exposed area by releasing the releaseable group from p-phenylenediamine structure, and to abrade the hydrophilic layer within the exposed area; and then printing an image with the lithographic plate mounted on a cylinder of a printing press, wherein the dye precursor is represented by the formula (I), and the visible dye is represented by the formula (II):

$$R_2N—(p\text{-}Ph)—N(—Y)—L—Z \quad (I)$$

$$R_2N—(p\text{-}Ph)—N{=}L \quad (II)$$

in which each of the two groups represented by R independently is hydrogen or an alkyl group having 1 to 20 carbon atoms; p-Ph is p-phenylene, which can be substituted with an alkyl group having 1 to 20 carbon atoms; L is a divalent linking group; and each of Y and Z independently is a releasable group.

* * * * *